(12) United States Patent
Kim et al.

(10) Patent No.: US 10,812,741 B2
(45) Date of Patent: Oct. 20, 2020

(54) PULSE GENERATOR OF IMAGE SENSOR AND METHOD OF DRIVING THE SAME

(71) Applicant: SAMSUNG ELECTRONICS CO., LTD., Suwon-si, Gyeonggi-do (KR)

(72) Inventors: Kyung Tae Kim, Hwaseong-si (KR); Kyung Min Kim, Hwaseong-si (KR); Yun Hwan Jung, Hwaseong-si (KR); Hee Sung Chae, Hwaseong-si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 16/543,016

(22) Filed: Aug. 16, 2019

(65) Prior Publication Data

US 2020/0260024 A1 Aug. 13, 2020

(30) Foreign Application Priority Data

Feb. 11, 2019 (KR) .................. 10-2019-0015603

(51) Int. Cl.
*H04N 5/357* (2011.01)
*H04N 5/374* (2011.01)
*H01L 27/146* (2006.01)
*H04N 5/378* (2011.01)
*H03M 1/12* (2006.01)

(52) U.S. Cl.
CPC ....... *H04N 5/357* (2013.01); *H01L 27/14603* (2013.01); *H03M 1/123* (2013.01); *H04N 5/374* (2013.01); *H04N 5/378* (2013.01)

(58) Field of Classification Search
CPC ........ H04N 5/357; H04N 5/374; H04N 5/378; H01L 27/146; H01L 27/14601; H01L 27/14603; H01L 27/14605; H01L 27/14607; H01L 27/14609; H01L 27/1461; H01L 27/14612

See application file for complete search history.

(56) References Cited

U.S. PATENT DOCUMENTS

| 7,330,146 | B2 | 2/2008 | Boemler |
| 8,907,835 | B2 * | 12/2014 | Tanaka .................. H04N 5/374 341/155 |
| 9,055,246 | B2 | 6/2015 | Tay |
| 9,237,286 | B2 | 1/2016 | Theuwissen |
| 9,509,931 | B2 | 11/2016 | Kobayashi et al. |
| 9,968,258 | B2 * | 5/2018 | Guo ......................... G01J 1/44 |

(Continued)

*Primary Examiner* — Ngoc Yen T Vu
(74) *Attorney, Agent, or Firm* — F. Chau & Associates, LLC

(57) ABSTRACT

A pulse generator of an image sensor includes a delay cell including a plurality of transistors arranged in series between a power voltage and a ground, a stabilization capacitor, and a stabilization switch. The power voltage is supplied to a first terminal of a first transistor disposed first among the plurality of transistors, and a gate terminal of the first transistor is connected to a first node. An input voltage is supplied to a gate terminal of an n-th transistor disposed last among the plurality of transistors, and a ground voltage is supplied to a first terminal of the n-th transistor. The stabilization switch is disposed between a reference voltage input terminal providing a reference voltage and the first node. The stabilization switch is turned on by an input bias control signal to supply the reference voltage to the first node.

20 Claims, 16 Drawing Sheets

(56) References Cited

U.S. PATENT DOCUMENTS

| | | |
|---|---|---|
| 10,110,842 B2 * | 10/2018 | Hoshina ............. H04N 5/23212 |
| 2010/0238336 A1 | 9/2010 | Okamoto et al. |
| 2013/0257502 A1 | 10/2013 | Dong et al. |
| 2016/0309107 A1 | 10/2016 | Sumitani et al. |
| 2018/0077368 A1 | 3/2018 | Suzuki |
| 2019/0132531 A1 * | 5/2019 | Nishida ................. H04N 5/378 |
| 2019/0335128 A1 * | 10/2019 | Kim ..................... H04N 5/3658 |

* cited by examiner

PULSE GENERATOR OF IMAGE SENSOR AND METHOD OF DRIVING THE SAME

CROSS-REFERENCE TO THE RELATED APPLICATION

This U.S. non-provisional patent application claims priority under 35 U.S.C. § 119 to and the benefit of Korean Patent Application No. 10-2019-0015603, filed on Feb. 11, 2019, in the Korean Intellectual Property Office (KIPO), the disclosure of which is incorporated by reference in its entirety herein.

BACKGROUND

1. Technical Field

The present inventive concept relates to a pulse generator of an image sensor including a delay cell that is not affected by a change in a power state and a method of driving the same.

2. Discussion of Related Art

An image sensor is a sensor that detects and conveys information used to generate an image. The image sensor may include a plurality of pixels, an analog-to-digital converter (ADC), and a counter. When the image sensor includes a large number of pixels, the ADC needs to operate at a high speed. As the ADC operates at higher speeds, a frequency of the counter increases, and power consumption of the image sensor increases in proportion to the frequency of the counter. A pulse generator method may be used to reduce power consumption of the image sensor during a counting period of the counter. However, in a typical pulse generator method, excessive noise may be generated since a width of a pulse generated by the method varies when a value of a power voltage changes.

SUMMARY

At least one embodiment of the present inventive concept is directed to providing a pulse generator for an image sensor that is not affected by a change in a power state in consideration of a power supply ripple rejection (PSRR) characteristic and a method of driving the same.

In addition, at least one embodiment of the present inventive concept is directed to providing a delay cell that is not affected by a horizontal noise, a random noise, a column fixed pattern noise, and a code linearity error, which may be generated by a change in a power voltage, and providing a pulse generator for an image sensor including the delay cell and a method of driving the same.

A pulse generator of an image sensor according to an exemplary embodiment of the present inventive concept includes a delay cell including a plurality of transistors arranged in series between a power voltage and a ground, a stabilization capacitor, and a stabilization switch. The power voltage is supplied to a first terminal of a first transistor disposed first among the plurality of transistors, and a gate terminal of the first transistor is connected to a first node. An input voltage is supplied to a gate terminal of an n-th transistor disposed last among the plurality of transistors, and a ground voltage is supplied to a first terminal of the n-th transistor. The stabilization capacitor is connected between the first terminal of the first transistor and the first node. The stabilization switch is disposed between a reference voltage input terminal providing a reference voltage and the first node. The stabilization switch is turned on by an input bias control signal to supply the reference voltage to the first node. The pulse generator of the image sensor may output a pulse signal to a counter on the basis of a transition of a comparison signal input from a comparator.

A pulse generator of an image sensor according to an exemplary embodiment of the present inventive concept includes a delay cell including a plurality of transistors arranged in series between a power voltage and a ground, a stabilization capacitor, and a stabilization switch. The power voltage is supplied to a first terminal of a first transistor disposed first among the plurality of transistors, and an input voltage is supplied to a gate terminal of the first transistor. A ground voltage is supplied to a first terminal of an n-th transistor disposed last among the plurality of transistors, and a gate terminal of the n-th transistor is connected to a first node. The stabilization capacitor is connected between the first terminal of the n-th transistor and the first node. The stabilization switch is disposed between a reference voltage input terminal providing a reference voltage and the first node. The stabilization switch is turned on by an input bias control signal to supply the reference voltage to the first node. The pulse generator of the image sensor may output a pulse signal to a counter on the basis of a transition of a comparison signal input from a comparator.

A pulse generator of an image sensor according to an exemplary embodiment of the present inventive concept includes a delay cell including a plurality of transistors arranged in series between a power voltage and a ground, a first stabilization capacitor, a second stabilization capacitor, a first stabilization switch, and a second stabilization switch. The power voltage is supplied to a first terminal of a first transistor disposed first among the plurality of transistors, and a gate terminal of the first transistor is connected to a first node. A ground voltage is supplied to a first terminal of an n-th transistor disposed last among the plurality of transistors, and a gate terminal of the n-th transistor is connected to a second node. The first stabilization capacitor is connected between the first terminal of the first transistor and the first node. The first stabilization switch is disposed between a first reference voltage input terminal providing a first reference voltage and the first node. The first stabilization switch is turned on by an input bias control signal to supply the first reference voltage to the first node. The second stabilization capacitor is connected between a second terminal of the n-th transistor and the second node. The second stabilization switch is disposed between a second reference voltage input terminal providing a second reference voltage and the second node. The second stabilization switch is turned on by the input bias control signal to supply the second reference voltage to the second node. The pulse generator of the image sensor may output a pulse signal to a counter on the basis of a transition of a comparison signal input from a comparator.

A pulse generator of an image sensor according to an exemplary embodiment of the present inventive concept includes a delay cell including a plurality of transistors arranged in series between a power voltage and a ground and a bias circuit connected to a gate terminal of a first transistor. The power voltage is supplied to a first terminal of a first transistor disposed first among the plurality of transistors, and a gate terminal of the first transistor is connected to a first node. An input voltage is supplied to a gate terminal of an n-th transistor disposed last among the plurality of transistors, and a ground voltage is supplied to a first terminal of the n-th transistor. The bias circuit includes a bias transistor and an operational-amplifier (op-amp). The bias transistor includes a first terminal to which the power voltage is supplied, a second terminal connected to the ground, and a gate terminal connected to the first transistor. The op-amp includes a positive terminal connected to the second terminal of the bias transistor and a negative terminal to which a reference voltage is applied. The pulse generator of the image sensor may constantly maintain a voltage across source and gate terminals of the first transistor.

A pulse generator of an image sensor according to an exemplary embodiment of the present inventive concept includes a delay cell including a plurality of transistors arranged in series between a power voltage and a ground and a bias circuit connected to a gate terminal of an n-th transistor. The power voltage is supplied to a first terminal of a first transistor disposed first among the plurality of transistors, and an input voltage is supplied to a gate terminal of the first transistor. A ground voltage is supplied to a first terminal of the n-th transistor disposed last among the plurality of transistors, and the gate terminal of the n-th transistor is connected to a first node. The bias circuit includes a bias transistor and an operational-amplifier (op-amp). The bias transistor includes a first terminal to which the power voltage is supplied, a second terminal connected to the ground, and a gate terminal connected to the n-th transistor. The op-amp includes a positive terminal connected to the first terminal of the bias transistor and a negative terminal to which a reference voltage is applied. The pulse generator of the image sensor may constantly maintain a voltage across source and gate terminals of the n-th transistor.

A pulse generator of an image sensor according to an exemplary embodiment of the present inventive concept includes a delay cell including a plurality of transistors arranged in series between a power voltage and a ground, a first bias circuit connected to a gate terminal of a first transistor, and a second bias circuit connected to a gate terminal of an n-th transistor. The power voltage is supplied to a first terminal of a first transistor disposed first among the plurality of transistors, and a gate terminal of the first transistor is connected to a first node. A ground voltage is supplied to a first terminal of the n-th transistor disposed last among the plurality of transistors, and the gate terminal of the n-th transistor is connected to a second node. The first bias circuit includes a first bias transistor and a first operational-amplifier (op-amp). The first bias transistor includes a first terminal to which the power voltage is supplied, a second terminal to which the ground voltage is supplied, and a gate terminal connected to an output terminal of the first op-amp and the gate terminal of the first transistor. The first op-amp includes a positive terminal connected to a second terminal of the first bias transistor and a negative terminal to which a reference voltage is applied. The second bias circuit includes a second bias transistor and a second op-amp. The second bias transistor includes a first terminal to which the power voltage is supplied, a second terminal to which the ground voltage is supplied, and a gate terminal connected to an output terminal of the second op-amp and the gate terminal of the n-th transistor. The second op-amp includes a positive terminal connected to a first terminal of the second bias transistor and a negative terminal to which a reference voltage is applied. The pulse generator of the image sensor may constantly maintain a voltage across source and gate terminals of the first transistor and a voltage across source and gate terminals of the n-th transistor.

BRIEF DESCRIPTION OF THE DRAWINGS

Exemplary embodiments of the present disclosure will be more clearly understood from the following detailed description taken in conjunction with the accompanying drawings.

DETAILED DESCRIPTION OF THE EXEMPLARY EMBODIMENTS

A typical pulse generator includes a delay cell including a transistor having a long length to reduce a current driving capability. A delay time of the typical delay cell is proportional to a charging and discharging time of an output node of the delay cell. In the typical delay cell, a difference in a delay of an output signal occurs according to a change in power. The difference in the delay of the output signal may cause a difference in a pulse width or point at which a pulse ends to vary so that an image signal is not read properly.

As an example, a dual correlated double sampling (CDS) method may be used in an image sensor to improve noise characteristics. In order to implement the dual CDS method, resetting and signal counting should be performed twice. When the signal counting is performed twice, a power voltage state at a reset counting time point may be different from the power voltage state at a signal counting time point. In such a case, a delay time of a pulse generator is changed so that dual CDS does not operate normally. Further, when the power voltage state in which images are processed changes row-by-row, horizontal noise increases.

Hereinafter, a pulse generator of an image sensor and a method of driving the same according to exemplary embodiments of the present inventive concept will be described with reference to the accompanying drawings.

Figure 1:
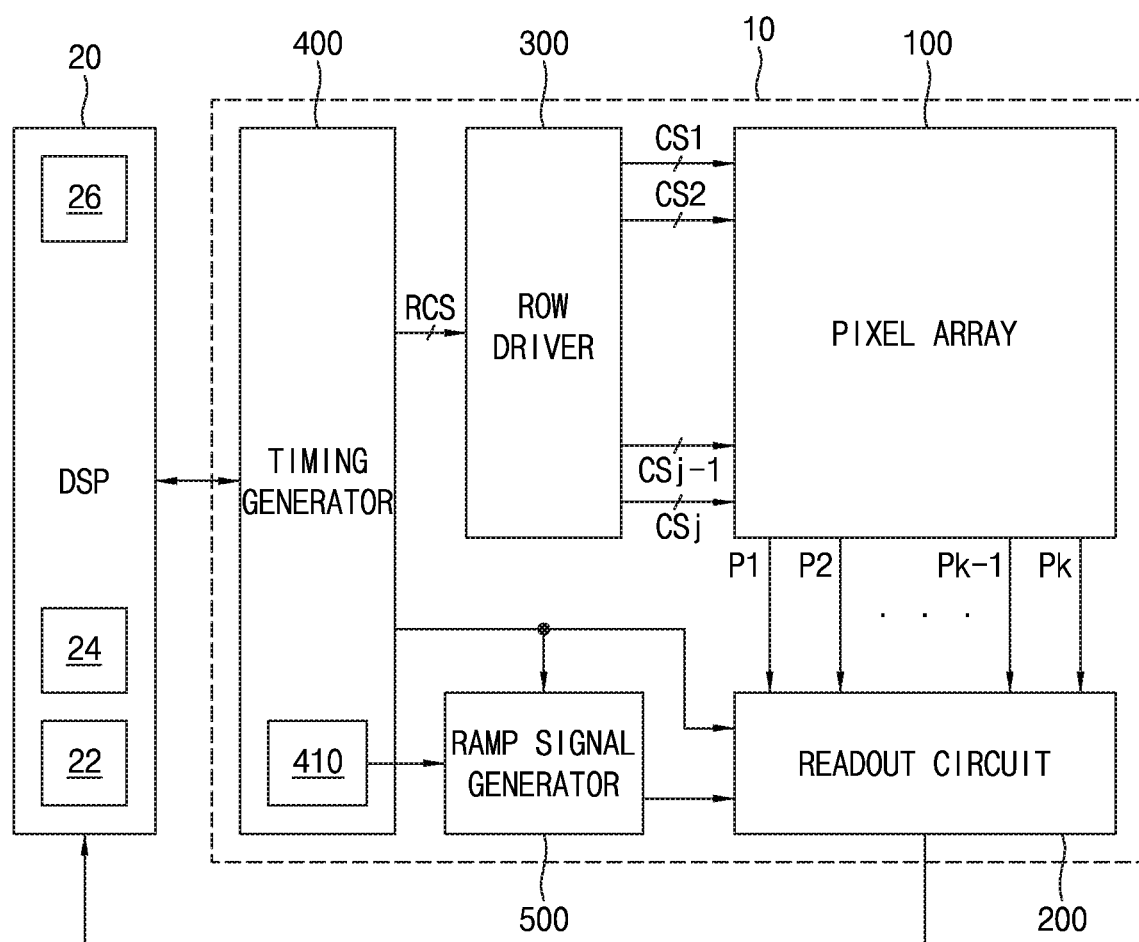
FIG. 1 is a block diagram of an image processing system including an image sensor according to an exemplary embodiment of the present inventive concept.
Figure 2:
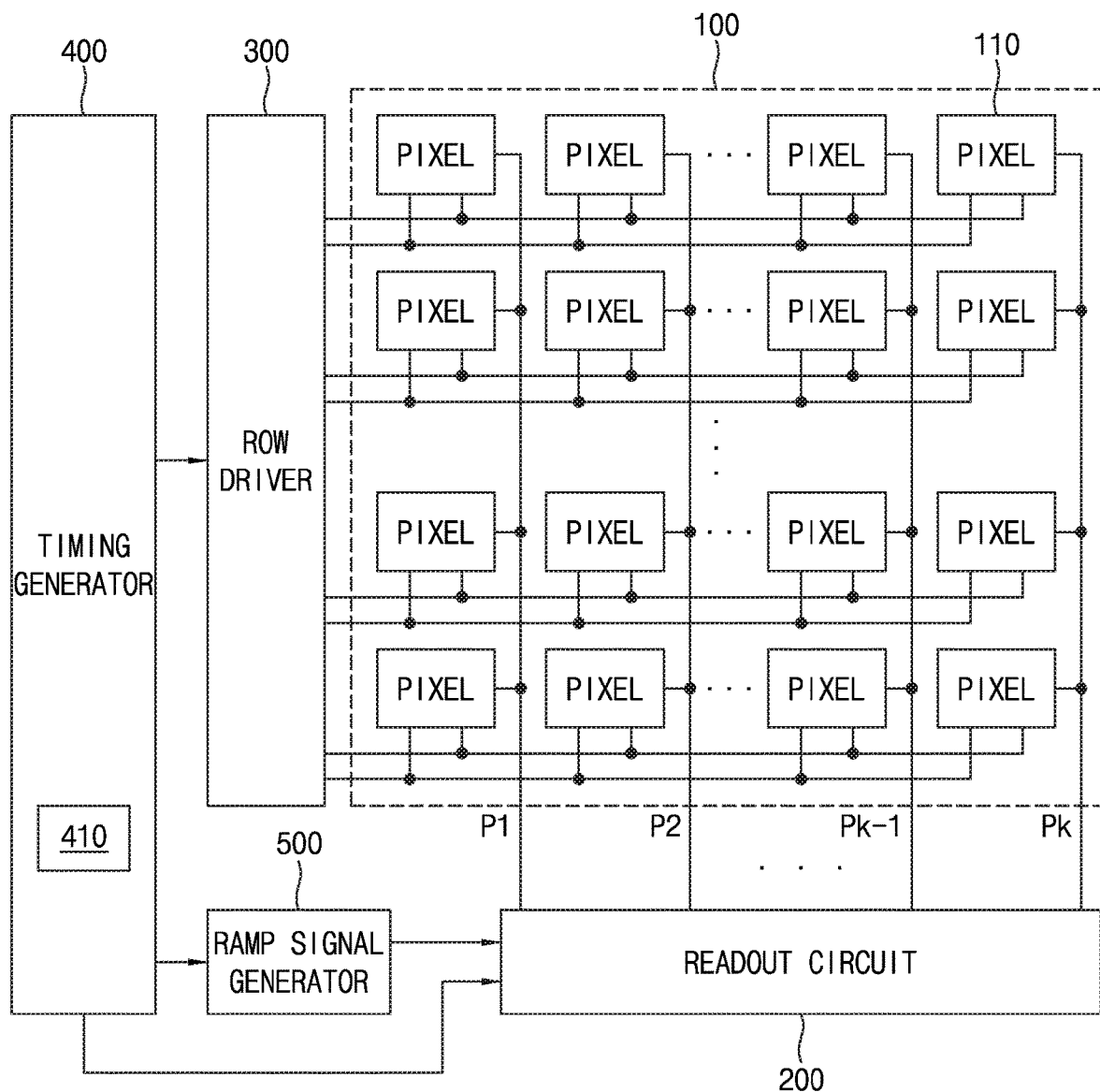
FIG. 2 is a view illustrating the image sensor shown in FIG. 1.

FIG. 1 is a block diagram of an image processing system including an image sensor according to an exemplary embodiment of the present inventive concept. FIG. 2 is a view illustrating the image sensor shown in FIG. 1.

Referring to FIGS. 1 and 2, the image processing system includes an image sensor 10 and a digital signal processor (DSP) 20. The image sensor 10 and the DSP 20 may each be implemented as one chip, or the image sensor 10 and the DSP 20 may be implemented as a single chip.

The image sensor 10 may generate digital pixel signals for a subject input through an optical lens. The image sensor 10 includes a pixel array 100, a readout circuit 200, a row driver 300 (e.g., row driving circuit), a timing generator 400 (e.g., timing control circuit), and a ramp signal generator 500.

The pixel array 100 may include a plurality of pixels 110 arranged in a matrix form. As an example, the pixel array 100 may include the plurality of pixels 110 arranged in the matrix form in which each of the pixels 110 is connected to a plurality of row lines and a plurality of column lines. An active pixel sensor (APS) may be applied to the plurality of pixels 110. For example, each pixel may include a photodetector and an active amplifier.

The pixels 110 may include a red filter that passes light in a red wavelength region, a green filter that passes light in a green wavelength region, and a blue filter that passes light in a blue wavelength region. However, the present inventive concept is not limited thereto. For example, the pixels 110 may include a transparent filter or a color filter that transmits light in wavelength regions of other colors.

As an example, the pixels 110 may include a white color filter, a cyan color filter, a magenta color filter, and/or a yellow color filter. Each pixel among the pixels 110 may include a plurality of transistors and a photodiode. Each of the plurality of pixels 110 may sense light using the photodiode and convert the sensed light into an electrical signal to generate an image signal. The plurality of pixels 110 constitute one pixel array 100, and each of the plurality of pixels 110 may be defined as a unit pixel.

The row driver 300 may generate a plurality of row control signals CS1 to CSj on the basis of a plurality of row driver control signals RCS received from the timing generator 400. The row driver 300 may transmit the plurality of row control signals CS1 to CSj to the pixel array 100 to control an operation of each of the plurality of pixels 110 under the control of the timing generator 400. Each of the plurality of row control signals CS1 to CSj corresponds to each of j rows of the pixel array 100, and thus the pixel array 100 may be controlled row by row. Each of the plurality of row control signals CS1 to CSj may include an overflow control signal, a storage control signal, a transfer control signal, a reset control signal, and a selection control signal. In response to the row control signals CS1 to CSj provided from the row driver 300, the pixel array 100 may output a reset signal and an image signal generated from the selected one or more rows to the readout circuit 200.

The timing generator 400 may include a control register block 410. The control register block 410 may control the operation of the timing generator 400, the ramp signal generator 500, and the readout circuit 200 under the control of the DSP 20. The timing generator 400 may generate the row driver control signals RCS so that the image sensor 10 operates in a global shutter mode or a rolling shutter mode depending on the operation mode thereof. In an exemplary embodiment, the row driver 300 applies the row control signals CS1 to CSj simultaneously to the pixel array 100 during the global shutter mode, and applies the row control signals CS1 to CSi sequentially to the pixel array 100 during the rolling shutter mode. The row driver control signals RCS generated in the timing generator 400 may be input to the row driver 300. A clock signal CNT_CLK may be input from the timing generator 400 to an analog-to-digital converter (ADC) block 210 of the readout circuit 200. The clock signal CNT_CLK may be generated in a counter controller (e.g., a counter control circuit) disposed in the timing generator 400.

The ramp signal generator 500 is driven on the basis of a control signal generated in the timing generator 400, and may generate a ramp signal Ramp and supply the generated ramp signal Ramp to the ADC block 210 of the readout circuit 200. The ramp signal generator 500 may be implemented by a circuit that creates a linear rising or falling output with respect to time.

The DSP 20 may include an image signal processor 22, a sensor controller 24 (e.g., a sensor control circuit), and an interface 26 (e.g., an interface circuit). The image signal processor 22 may control the sensor controller 24, which controls the control register block 410, and the interface 26.

As an example, the image sensor 10 and the DSP 20 may each be implemented as a chip or may be implemented as a single package, for example, a multi-chip package.

As an example, the image sensor 10 and the image signal processor 22 may each be implemented as a chip or may be implemented as a single package, for example, a multi-chip package.

As an example, the image sensor 10 and the image signal processor 22 may be implemented as a single chip.

The image signal processor 22 may process the digital pixel signals received from a buffer circuit 220 of the readout circuit 200 and transmit the processed image data to the interface 26.

The sensor controller 24 may generate various control signals for controlling the row driver 300, the timing generator 400, the readout circuit 200, and the ramp signal generator 500 under the control of the image signal processor 22.

The interface 26 may output the image data processed in the image signal processor 22 to the outside. As an example, the interface 26 may output image data IDATA processed in the image signal processor 22 to a display.

As an example, the display may be implemented as a thin film transistor-liquid crystal display (TFT-LCD), a light-emitting diode (LED) display, an organic LED (OLED) display, or an active-matrix OLED (AMOLED) display.

The image processing system may be implemented as a portable electronic device. The portable electronic device may be implemented as a laptop computer, a mobile phone, a smart phone, a tablet PC, a personal digital assistant (PDA), an enterprise digital assistant (EDA), a digital still camera, a digital video camera, a portable multimedia player (PMP), a mobile internet device (MID), a wearable computer, an internet of things (IoT) device, or an internet of everything (IoE) device.

Figure 3:
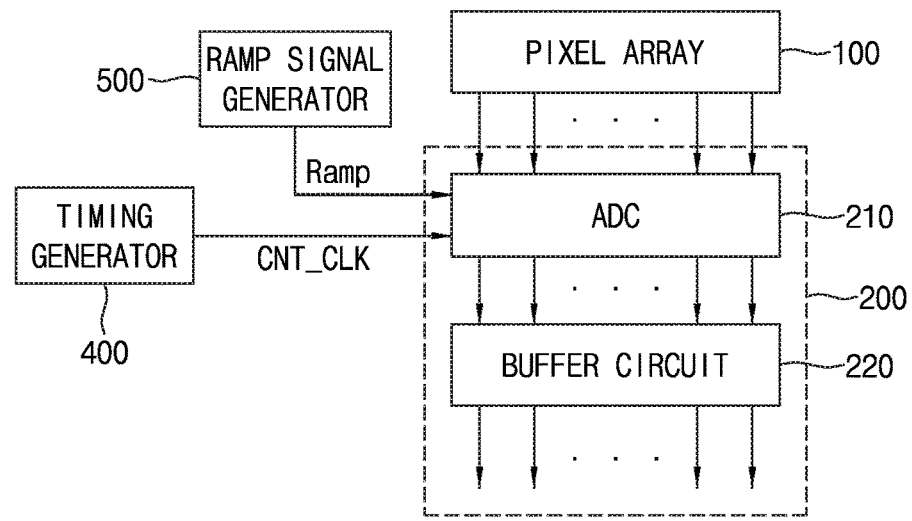
FIG. 3 is a view illustrating the pixel array and the readout circuit shown in FIG. 1.
Figure 4:
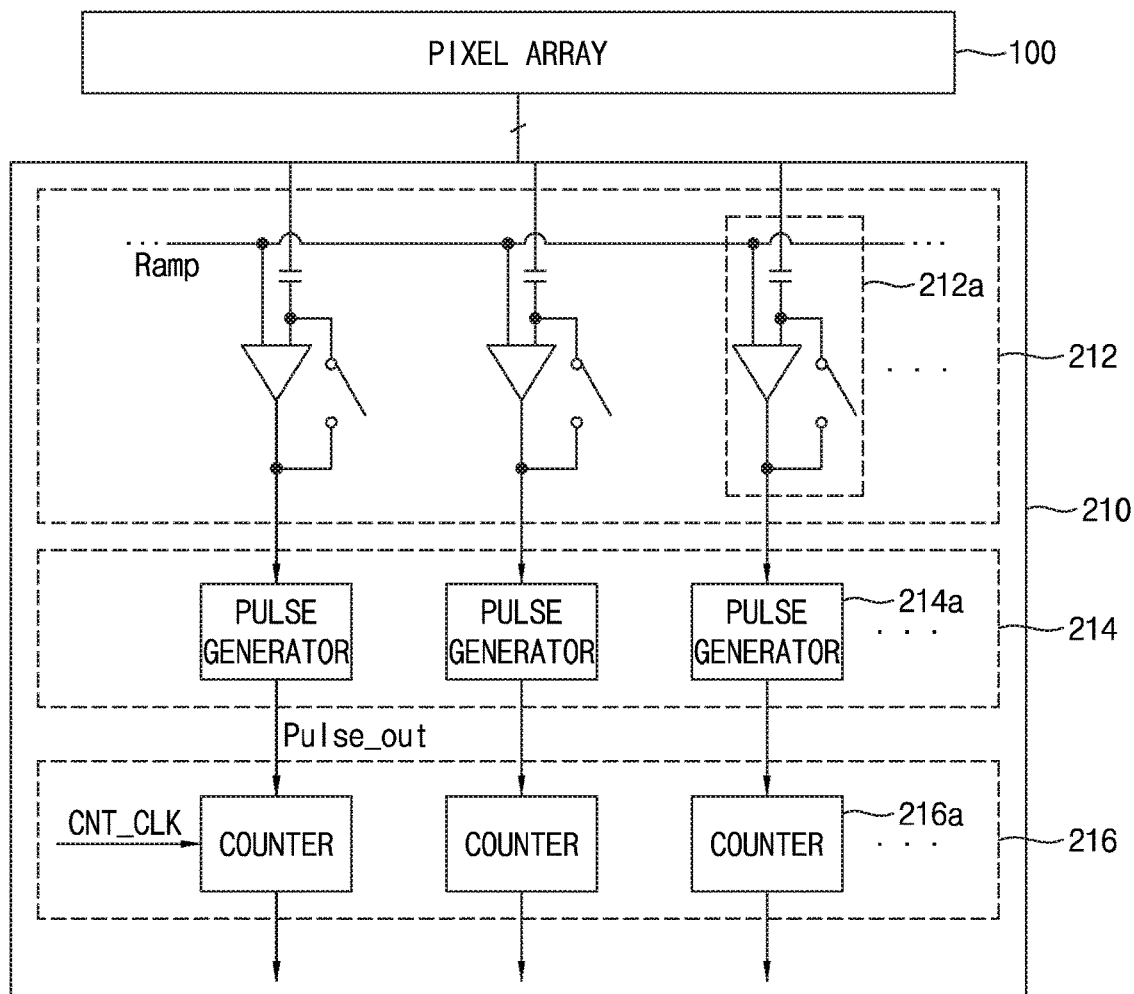
FIG. 4 is a view illustrating an ADC block shown in FIG. 3.

FIG. 3 is a view illustrating the pixel array and the readout circuit shown in FIG. 1. FIG. 4 is a view illustrating the ADC block shown in FIG. 3.

Referring to FIGS. 1 to 4, the readout circuit 200 includes the ADC block 210 and the buffer circuit 220.

In an embodiment, the ADC block 210 includes a plurality of correlated double sampling (CDS) circuits (hereinafter referred to as a "CDS circuit") and a counter block 216. The CDS circuits include a comparator block 212 including a plurality of comparators 212a and a pulse generator block 214 including a plurality of pulse generators 214a. The comparator block 212 may be defined as an analog CDS circuit, and the pulse generator block 214 may be defined as a digital CDS circuit.

The comparator block 212 may include the plurality of comparators 212a disposed to correspond to the plurality of column lines disposed in the pixel array 100. The plurality of comparators 212a may be connected to the unit pixels 110 and the ramp signal generator 500 on a column basis. Output terminals of the plurality of comparators 212a may be connected to the plurality of pulse generators 214a.

The plurality of comparators 212a may perform CDS on pixel signals P1 to Pk (wherein k is a natural number) output from the plurality of column lines disposed in the pixel array 100. The plurality of comparators 212a may compare (for example, compare voltage levels) correlated double sampled pixel signals with the ramp signal RAMP output from the ramp signal generator 500. The plurality of comparators 212a may output comparison signals CDS_OUT on the basis of comparison results of the correlated double sampled pixel signals and the ramp signal RAMP. For example, one of the comparators 212a could compare pixel signal P1 with the ramp signal RAMP to output a first one of the comparison signals CDS_OUT.

As an example, in order to output a difference between the image signal and a reset signal, the plurality of comparators 212a may pick up the difference between the image signal and the reset signal using the ramp signal RAMP. The reset signal may be used to remove noise from the image signal. Further, the plurality of comparators 212a may generate the comparison signals CDS_OUT according to a slope of the ramp signal Ramp. The plurality of comparators 212a may output the comparison signals CDS_OUT to the plurality of pulse generators 214a.

As an example, each of the plurality of comparators 212a may receive a pixel voltage which is an output of a unit pixel 110 and the ramp signal Ramp and may compare the pixel voltage with the ramp signal to output the comparison signal CDS_OUT.

Figure 5:
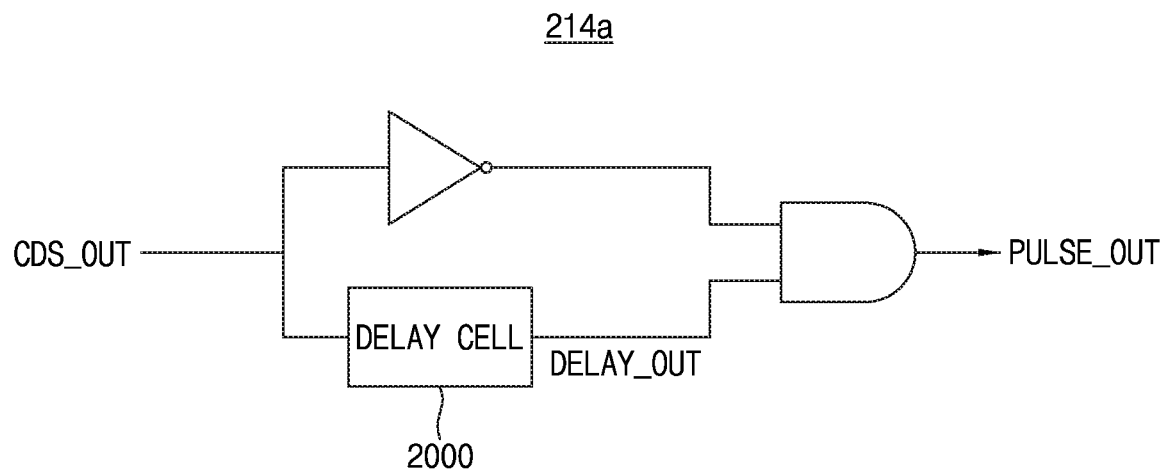
FIG. 5 is a view illustrating the pulse generator shown in FIG. 4.
Figure 6:
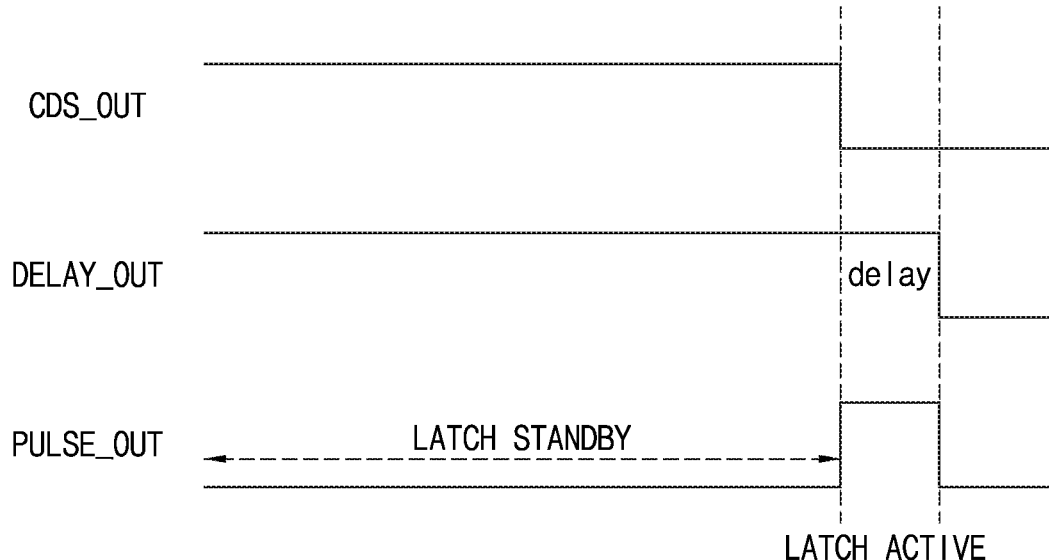
FIG. 6 is a view illustrating that a signal having a delay is generated based on a time at which an output transition of correlated double sampling circuit (CDS) occurs.

FIG. 5 is a view illustrating a pulse generator shown in FIG. 4 according to an exemplary embodiment of the inventive concept. FIG. 6 is a view illustrating that a signal having a delay is generated based on a time at which an output transition of the CDS occurs.

Referring to FIGS. 5 and 6, each of the plurality of pulse generators 214a may include a delay cell 2000. An input terminal of the delay cell 2000 is connected to an output terminal of a comparator 212a. The plurality of pulse generators 214a may generate delay signals DELAY_OUT delayed for a certain period of time based on a time at which the comparison signals CDS_OUT of the plurality of comparators 212a are output (that is, the moment at which a transition of a comparison signal occurs) in a latch type counter structure.

The plurality of pulse generators 214a may receive the comparison signals CDS_OUT and output pulse signals PULSE_OUT. The delay cell 2000 may output the pulse signal PULSE_OUT by inverting and/or delaying the comparison signal CDS_OUT. In an embodiment, the delay cell 2000 is implemented by an inverter circuit or a buffer circuit. The plurality of pulse generators 214a may latch-drive the generated delay signals so that a latch standby period occurs until the pulse is generated. The plurality of pulse generators 214a may generate pulses having a certain time width after the comparison signals CDS_OUT are input so that counting values are stored in latch stages of the buffer circuit 220.

In order for a plurality of counters 216a to operate at a high speed, a high-speed clock signal is required, which causes power consumption in the comparator 212a, the pulse generator 214a, the counter 216a, and the buffer circuit 220 to increase. The pulse generator 214a according to at least one embodiment of the present inventive concept allows the latch to be driven only in a period in which the pulse is generated so that the input value may be stored in the latch stage of the buffer circuit 220. Thus, the power consumed in the readout circuit 200 during the latching may be reduced.

As shown in FIG. 4, the counter block 216 may include the plurality of counters 216a. Input terminals of the plurality of counters 216a may be connected to output terminals of the plurality of pulse generators 214a. The plurality of counters 216a may count the comparison signals CDS_OUT output from the plurality of comparators 212a according to the clock signal CNT_CLK input from the timing generator 400. The plurality of counters 216a may count the comparison signals CDS_OUT to generate counting signals (digital signals) and output the generated counting signals (digital signals). That is, the ADC block 210 may convert analog signals received from the pixel array 100 into digital signals and output the digital signals.

As shown in FIG. 3, the buffer circuit 220 may include a plurality of latch circuits, for example, static random access memories (SRAMs), connected to each of the column lines. The buffer circuit 220 may latch and amplify output signals of the ADC block 210 to generate the digital pixel signals (sensor output signal of each pixel). The buffer circuit 220 may output the digital pixel signals (image data) to the DSP 20.

As an example, the latch circuits of the buffer circuit 220 may latch the counting signals, which are output from the plurality of counters 216a in response to transitions of the comparison signals CDS_OUT, for each column. The latch circuits of the buffer circuit 220 may output the latched counting signals as the digital pixel signals (image data).

The buffer circuit 220 may include an output correction circuit that corrects the output signals of the ADC block 210. The output correction circuit may correct the output signals using a signal corresponding to a row line with an optical signal and a signal corresponding to a row line without the optical signal among the output signals of the ADC block 210.

Figure 7A:
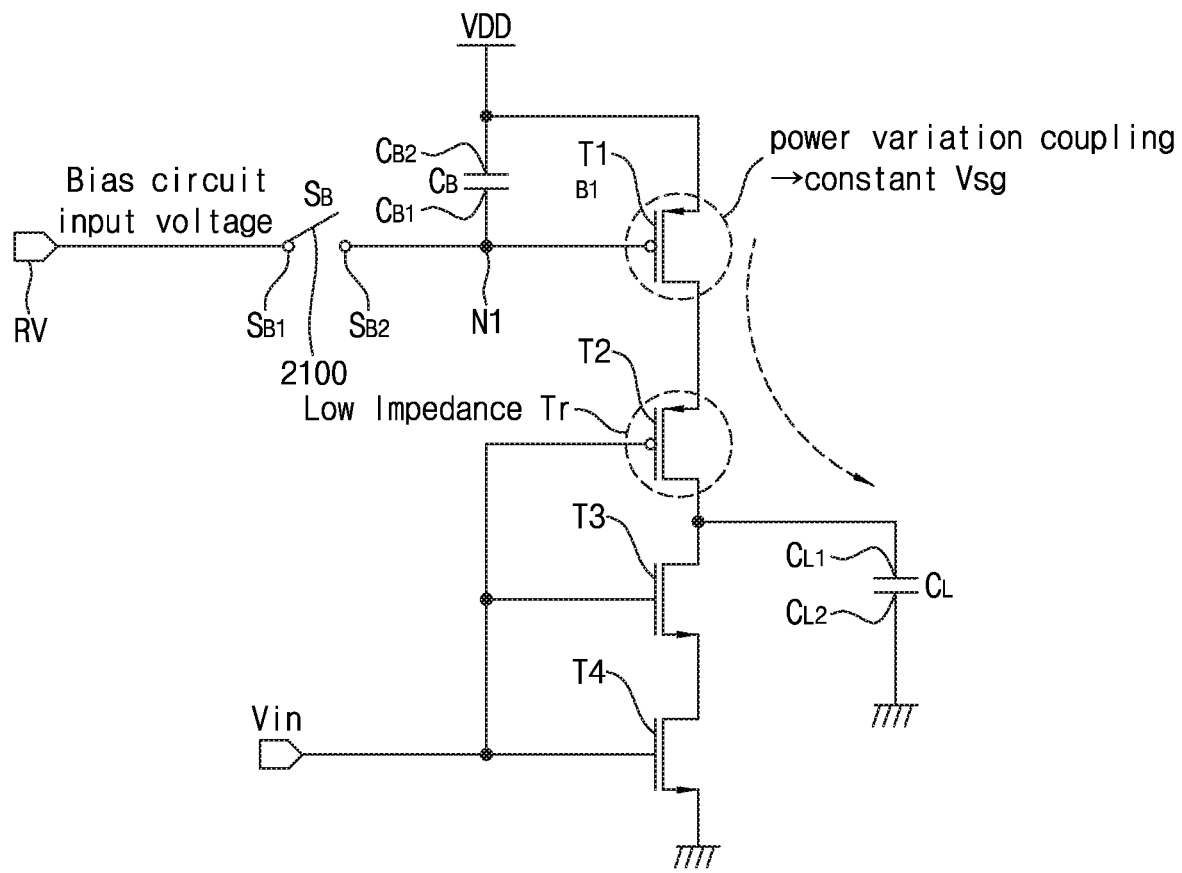
FIG. 7A illustrates a delay cell according to an exemplary embodiment of the present inventive concept and is a view illustrating a P-type delay cell.
Figure 8A:
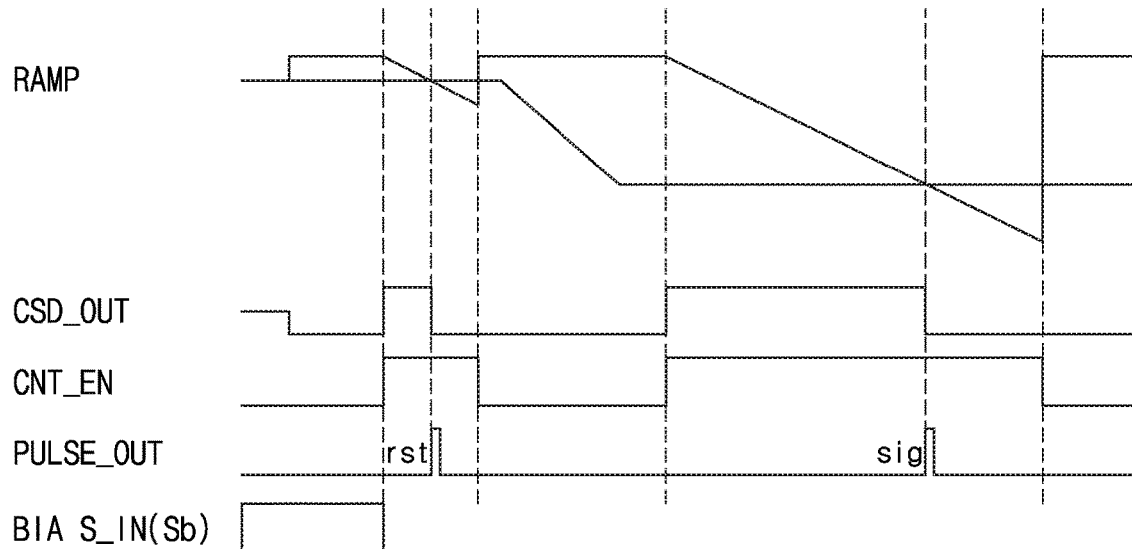
FIG. 8A is a view illustrating a driving method of a pulse generator in an operation timing of the ADC performing dual CDS.
Figure 8B:
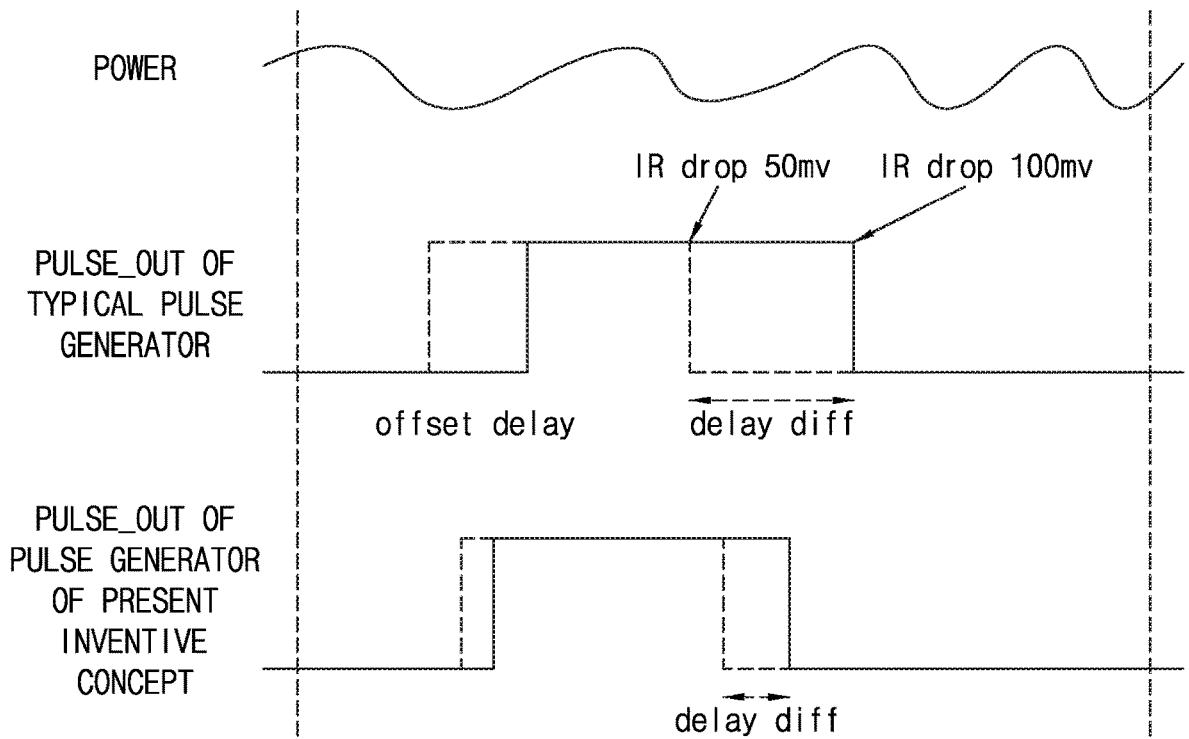
FIG. 8B is a view illustrating an output pulse of the pulse generator.

FIG. 7A illustrates a delay cell according to an exemplary embodiment of the present inventive concept and is a view illustrating a P-type delay cell. FIG. 8A is a view illustrating a driving method of a pulse generator in an operation timing of the ADC performing dual CDS. FIG. 8B is a view illustrating an output pulse of the pulse generator.

Referring to FIGS. 7A to 8B, each of the plurality of pulse generators 214a includes a P-type delay cell 2000. The P-type delay cell 2000 includes a plurality of transistors T1 to T4, a plurality of capacitors $C_B$ and $C_L$, and a stabilization switch 2100. Although the P-type delay cell 2000 is illustrated as including four transistors T1 to T4 in FIG. 7A, the present inventive concept is not limited thereto, and the number of transistors may be varied.

The plurality of transistors T1 to T4 may be connected to each other in series. As an example, a first transistor T1, a second transistor T2, a third transistor T3, and a fourth transistor T4 are connected to each other in series. As an example, the first transistor T1 and the second transistor T2 may each be a P-type metal-oxide-semiconductor (P-MOS) transistor. As an example, the third transistor T3 and the fourth transistor T4 may each be an N-type MOS (N-MOS) transistor.

A first terminal $C_{B1}$ of a stabilization capacitor $C_B$, a gate terminal of the first transistor T1, and a second terminal $S_{B2}$ of a stabilization switch 2100 or $S_B$ is connected to a first node N1.

The first transistor T1 includes a first terminal to which a power voltage VDD is input and a second terminal that is connected to the second transistor T2. The stabilization capacitor $C_B$ is disposed between the gate terminal and the first terminal of the first transistor T1. The gate terminal of the first transistor T1 is connected to the second terminal $S_{B2}$ of the stabilization switch 2100 or $S_B$ and the first terminal $C_{B1}$ of the stabilization capacitor $C_B$.

The first terminal $C_{B1}$ of the stabilization capacitor $C_B$ is connected to the gate terminal of the first transistor T1 and the second terminal $S_{B2}$ of the stabilization switch 2100 or $S_B$. A second terminal $C_{B2}$ of the stabilization capacitor $C_B$ is connected to a power voltage VDD terminal and the first terminal of the first transistor T1.

A first terminal $S_{B1}$ of the stabilization switch 2100 or $S_B$ is connected to a reference voltage input terminal RV. A reference voltage (for example, a bias circuit input voltage) may be input to the first terminal $S_{B1}$ of the stabilization switch 2100 or $S_B$. The second terminal $S_{B2}$ of the stabilization switch 2100 or $S_B$ is connected to the gate terminal of the first transistor T1.

The stabilization switch 2100 or $S_B$ may maintain an on-state or an off-state on the basis of an input bias control signal BIAS_IN ($S_B$).

As an example, the stabilization switch 2100 or $S_B$ is turned on when the bias control signal BIAS_IN ($S_B$) is input, and the stabilization switch 2100 or $S_B$ is turned off when the bias control signal BIAS_IN ($S_B$) is not input.

As an example, the stabilization switch 2100 or $S_B$ is turned off when the bias control signal BIAS_IN ($S_B$) is input, and the stabilization switch 2100 or $S_B$ is turned on when the bias control signal BIAS_IN ($S_B$) is not input.

The gate terminal of the first transistor T1, the first terminal $C_{B1}$ of the stabilization capacitor $C_B$, and the second terminal $S_{B2}$ of the stabilization switch 2100 or $S_B$ are connected to each other at the first node N1.

A first terminal of the second transistor T2 is connected to the second terminal of the first transistor T1. A second terminal of the second transistor T2 is connected to a second terminal of the third transistor T3 and a sampling capacitor $C_L$. An input voltage Vin is applied to a gate terminal of the second transistor T2.

A first terminal of the third transistor T3 is connected to a second terminal of the fourth transistor T4. The second terminal of the third transistor T3 is connected to the second terminal of the second transistor T2 and the sampling capacitor $C_L$. The input voltage Vin is applied to a gate terminal of the third transistor T3.

A first terminal $C_{L1}$ of the sampling capacitor $C_L$ is connected to the second terminal of the second transistor T2 and the second terminal of the third transistor T3. A second terminal $C_{L2}$ of the sampling capacitor $C_L$ is connected to a ground GND terminal.

A first terminal of the fourth transistor T4 is connected to the ground GND terminal. The second terminal of the fourth transistor T4 is connected to the first terminal of the third transistor T3. The input voltage Vin is applied to a gate terminal of the fourth transistor T4.

As an example, the first transistor T1 has a first impedance value. In an exemplary embodiment, the second transistor T2 has a second impedance lower than an impedance of the first transistor T1.

As an example, the third transistor T3 has a third impedance value. In an exemplary embodiment, the second transistor T2 has a second impedance lower than an impedance of the third transistor T3. In an exemplary embodiment, the first impedance value and the third impedance value are the same.

When the stabilization switch 2100 or $S_B$ is turned on, the reference voltage (for example, the bias circuit input voltage) is supplied to the first node N1.

In an exemplary embodiment, the stabilization switch 2100 or $S_B$ maintains an on-state before a reset signal is output so that the reference voltage (for example, the bias circuit input voltage) is supplied to the first node N1. In this embodiment, the stabilization switch 2100 or $S_B$ maintains an off-state during a period in which the reset signal is output.

In an embodiment, the stabilization switch 2100 or $S_B$ maintains an on-state before a pulse signal PULSE_OUT is output so that the reference voltage (for example, the bias circuit input voltage) is supplied to the first node N1. In this embodiment, the stabilization switch 2100 or $S_B$ maintains an off-state during a period in which the pulse signal PULSE_OUT is output.

Thus, Vgs or Vsg (e.g., a voltage across a gate terminal and a source terminal) of the first transistor T1 connected to the first node N may be constantly maintained so that a constant current flows regardless of variations of the power voltage VDD and a ground GND. A constant current charging/discharging may be ensured in the P-type delay cell 2000. The plurality of pulse generators 214a may generate and output the pulse signal PULSE_OUT having a small delay difference.

In FIG. 8B, a difference in a pulse end according to a change in the power voltage VDD may be defined as a "delay diff". Resistances of the transistors T1 to T4 disposed in the delay cell 2000 may be different from each other according to changes in the power voltage VDD and/or the ground GND, and thus time points at which the pulses are generated may be different from each other. The difference in the time points at which the pulses are generated may be defined as an "offset delay". The pulse generator 214a including the delay cell 2000 of the present inventive concept may improve a value of the "delay diff" by 50% to 80% and output the pulse signal PULSE_OUT having a small delay difference.

Figure 7B:
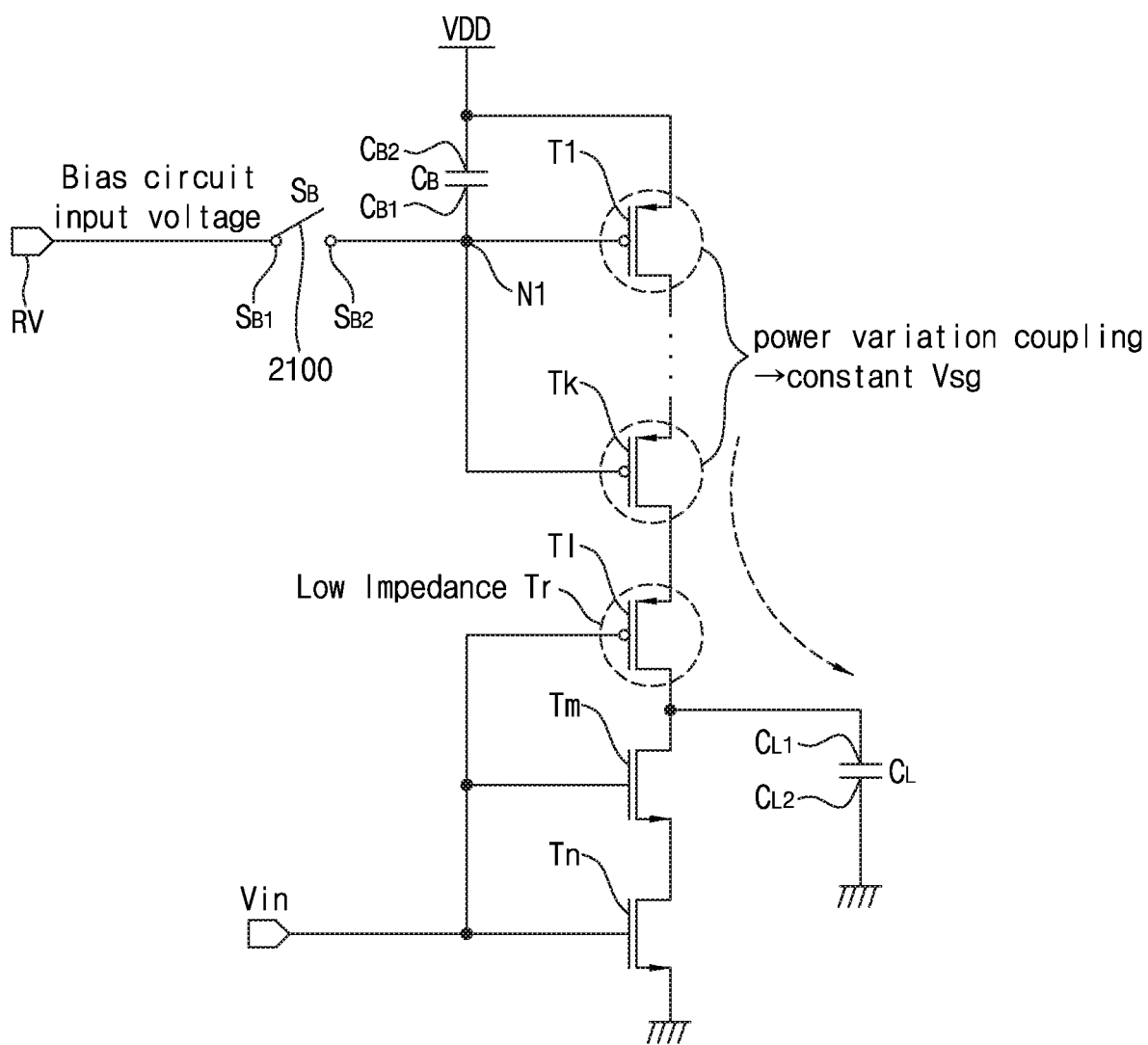
FIG. 7B illustrates a delay cell according to an exemplary embodiment of the present inventive concept and is a view illustrating a P-type delay cell.

FIG. 7B illustrates a delay cell according to an exemplary embodiment of the present inventive concept and is a view illustrating a P-type delay cell. In describing a delay cell 2000a shown in FIG. 7B, the description of the same configuration as the delay cell 2000 described with reference to FIG. 7A may be omitted.

Referring to FIG. 7B, each of the plurality of pulse generators 214a may include a P-type delay cell 2000a. The P-type delay cell 2000a includes a plurality of transistors T1 to Tn, a plurality of capacitors $C_B$ and $C_L$, and a stabilization switch 2100. Although the P-type delay cell 2000a is illustrated as including n transistors T1 to Tn in FIG. 7B, the present inventive concept is not limited thereto, and the number of transistors may be varied.

In FIG. 7A, the P-type delay cell 2000 is shown, in which one transistor, that is, the first transistor T1, is connected to the first node N1. In FIG. 7B, the P-type delay cell 2000a is shown in which a plurality of transistors T1 to Tk are connected to a first node N1.

The plurality of transistors T1 to Tn may be connected to each other in series. As an example, a first transistor T1 to an n-th transistor Tn are connected to each other in series. As an example, each of the first transistor T1 to an 1-th transistor T1 of the transistors T1 to Tn is a P-MOS transistor. As one example, each of an m-th transistor Tm and the n-th transistor Tn of the transistors T1 to Tn is an N-MOS transistor.

A first terminal $C_{B1}$ of a stabilization capacitor $C_B$, a second terminal $S_{B2}$ of a stabilization switch 2100 or $S_B$, and gate terminals of the first transistor T1 to a k-th transistor Tk are connected to the first node N1. That is, the gate terminals of the plurality of transistors T1 to Tk are connected to the first node N1.

When the stabilization switch 2100 or $S_B$ is turned on, a reference voltage (for example, a bias circuit input voltage) is supplied to the first node N1.

In an exemplary embodiment, the stabilization switch 2100 or $S_B$ maintains an on-state before a reset signal is output so that the reference voltage (for example, the bias circuit input voltage) is supplied to the first node N1, and the stabilization switch 2100 or $S_B$ maintains an off-state during a period in which the reset signal is output.

In an exemplary embodiment, before a pulse signal PULSE_OUT is output, the stabilization switch 2100 or $S_B$ maintains an on-state so that the reference voltage (for example, the bias circuit input voltage) is supplied to the first node N1, and the stabilization switch 2100 or $S_B$ maintains an off-state during a period in which the pulse signal PULSE_OUT is output.

Vgs or Vsg of the plurality of transistors T1 to Tk connected to the first node N1 may be constantly maintained. That is, Vgs or Vsg of the first transistor T1 to the k-th transistor Tk may be constantly maintained. Thus, a constant current may flow regardless of variations of a power voltage VDD and a ground GND. A constant current charging/discharging may be ensured in the P-type delay cell 2000a. The plurality of pulse generators 214a may generate and output the pulse signal PULSE_OUT having a small delay difference.

Figure 7C:
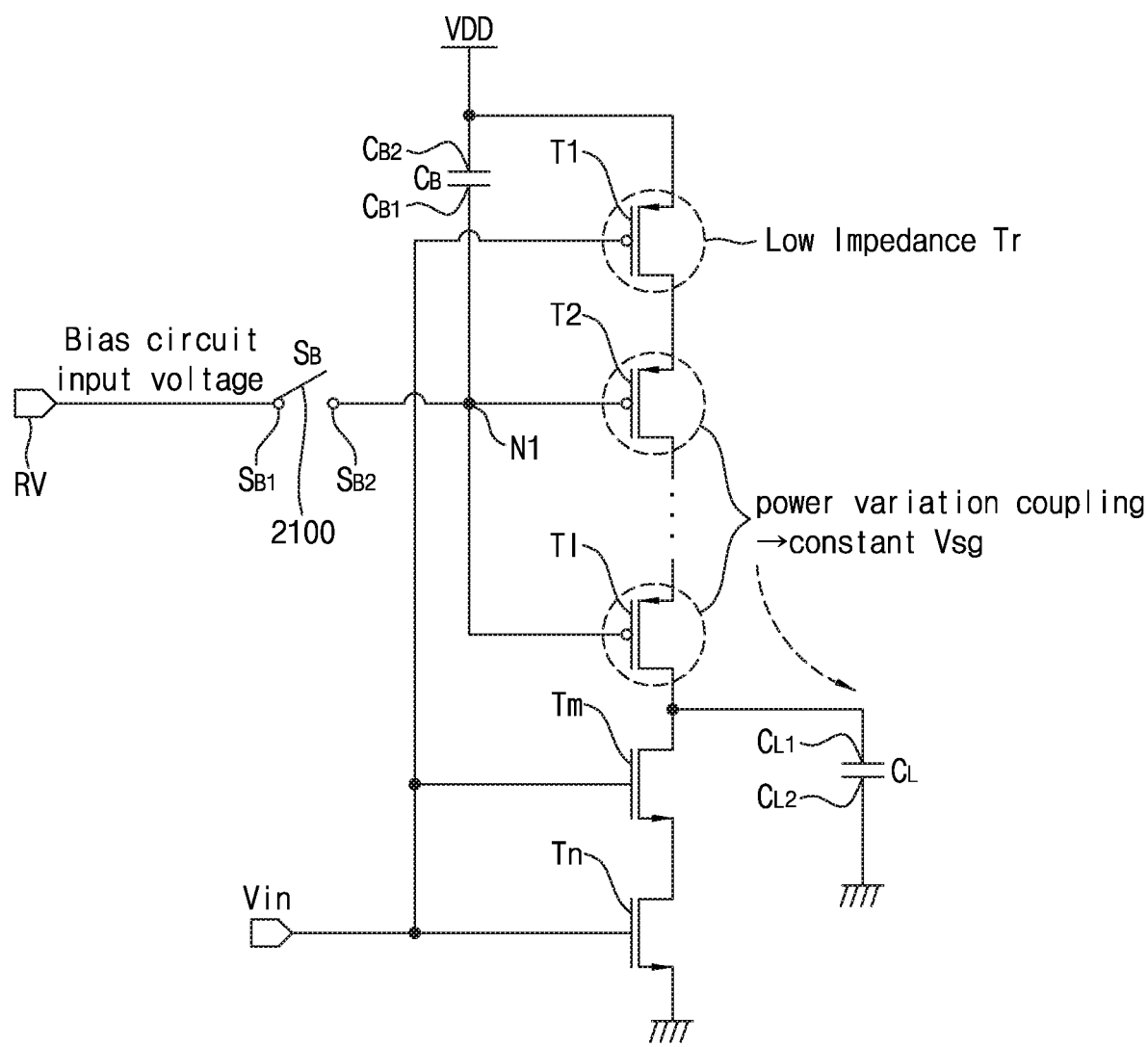
FIG. 7C illustrates a delay cell according to an exemplary embodiment of the present inventive concept and is a view illustrating a P-type delay cell.

FIG. 7C illustrates a delay cell according to an exemplary embodiment of the present inventive concept and is a view illustrating a P-type delay cell. In describing a delay cell 2000b shown in FIG. 7C, the description of the same configuration as the delay cell 2000 described with reference to FIG. 7A may be omitted.

Referring to FIG. 7C, each of the plurality of pulse generators 214a may include a P-type delay cell 2000b. The P-type delay cell 2000b includes a plurality of transistors T1 to Tn, a plurality of capacitors $C_B$ and $C_L$, and a stabilization switch 2100. Although the P-type delay cell 2000b is illustrated as including n transistors T1 to Tn in FIG. 7C, the present inventive concept is not limited thereto, and the number of transistors may be varied.

In FIG. 7A, the P-type delay cell 2000 is shown in which one transistor, that is, the first transistor T1, is connected to the first node N1. In FIG. 7C, the P-type delay cell 2000b is shown in which a plurality of transistors T2 to T1 are connected to a first node N1.

The plurality of transistors T1 to Tn may be connected to each other in series. As an example, a first transistor T1 to an n-th transistor Tn are connected to each other in series. As an example, each of the first transistor T1 to an 1-th transistor T1 among the transistors T1 to Tn is a P-MOS transistor. As an example, each of an m-th transistor Tm and the n-th transistor Tn among the transistors T1 to Tn is an N-MOS transistor.

A first terminal $C_{B1}$ of a stabilization capacitor $C_B$, a second terminal $S_{B2}$ of a stabilization switch 2100 or $S_B$, and gate terminals of a second transistor T2 to the 1-th transistor T1 are connected to the first node N1. That is, the gate terminals of the plurality of transistors T2 to T1 are connected to the first node N1.

A gate terminal of the first transistor T1 disposed first among the P-MOS transistors is not connected to the first node N1. The gate terminal of the first transistor T1 is connected to a gate terminal of the m-th transistor Tm and a gate terminal of the n-th transistor Tn. An input voltage Vin is applied to the gate terminal of the first transistor T1. The first transistor T1 includes a first terminal to which a power voltage VDD is input and a second terminal that is connected to the second transistor T2.

A second terminal of the 1-th transistor T1 is connected to a first terminal of the m-th transistor Tm and a first terminal $C_{L1}$ of a sampling capacitor $C_L$. The gate terminal of the 1-th transistor T1 is connected to the first node N1.

The first terminal of the m-th transistor Tm is connected to the second terminal of the 1-th transistor T1 and the first terminal $C_{L1}$ of the sampling capacitor $C_L$. A second terminal of the m-th transistor Tm is connected to a first terminal of the n-th transistor Tn. The input voltage Vin is applied to the gate terminal of the m-th transistor Tm.

The first terminal $C_{B1}$ of the stabilization capacitor $C_B$ is connected to the gate terminals of the second transistor T2 to the 1-th transistor T. The first terminal $C_{B1}$ of the stabilization capacitor $C_B$ is connected to a second terminal $S_{B2}$ of the stabilization switch 2100 or $S_B$.

A second terminal $C_{B2}$ of the stabilization capacitor $C_B$ is connected to a power voltage VDD terminal and the first terminal of the first transistor T1.

The gate terminals of the second transistor T2 to the 1-th transistor T1 are connected to the second terminal $S_{B2}$ of the stabilization switch 2100 or $S_B$ and the first terminal $C_{B1}$ of the stabilization capacitor $C_B$. That is, the gate terminals of the second transistor T2 to the 1-th transistor T1 are connected to the first node N1.

The input voltage Vin is applied to the gate terminals of the m-th transistor Tm and the n-th transistor Tn.

When the stabilization switch 2100 or $S_B$ is turned on, a reference voltage (for example, a bias circuit input voltage) is supplied to the first node N1.

In an embodiment, the stabilization switch 2100 or $S_B$ maintains an on-state before a reset signal is output so that the reference voltage (for example, the bias circuit input voltage) is supplied to the first node N1, and the stabilization switch 2100 or $S_B$ maintains an off-state during a period in which the reset signal is output.

In an embodiment, the stabilization switch 2100 or $S_B$ maintains an on-state before a pulse signal PULSE_OUT is output so that the reference voltage (for example, the bias circuit input voltage) is supplied to the first node N1, and the stabilization switch 2100 or $S_B$ maintains an off-state during a period in which the pulse signal PULSE_OUT is output.

Vgs or Vsg of the plurality of transistors T2 to T1 connected to the first node N1 may be constantly maintained. That is, Vgs or Vsg of the second transistor T2 to the 1-th transistor T1 may be constantly maintained. Thus, a constant current may flow regardless of variations of the power voltage VDD and a ground GND. A constant current charging/discharging may be ensured in the P-type delay cell 2000b. The plurality of pulse generators 214a may generate and output the pulse signal PULSE_OUT having a small delay difference.

Figure 9A:
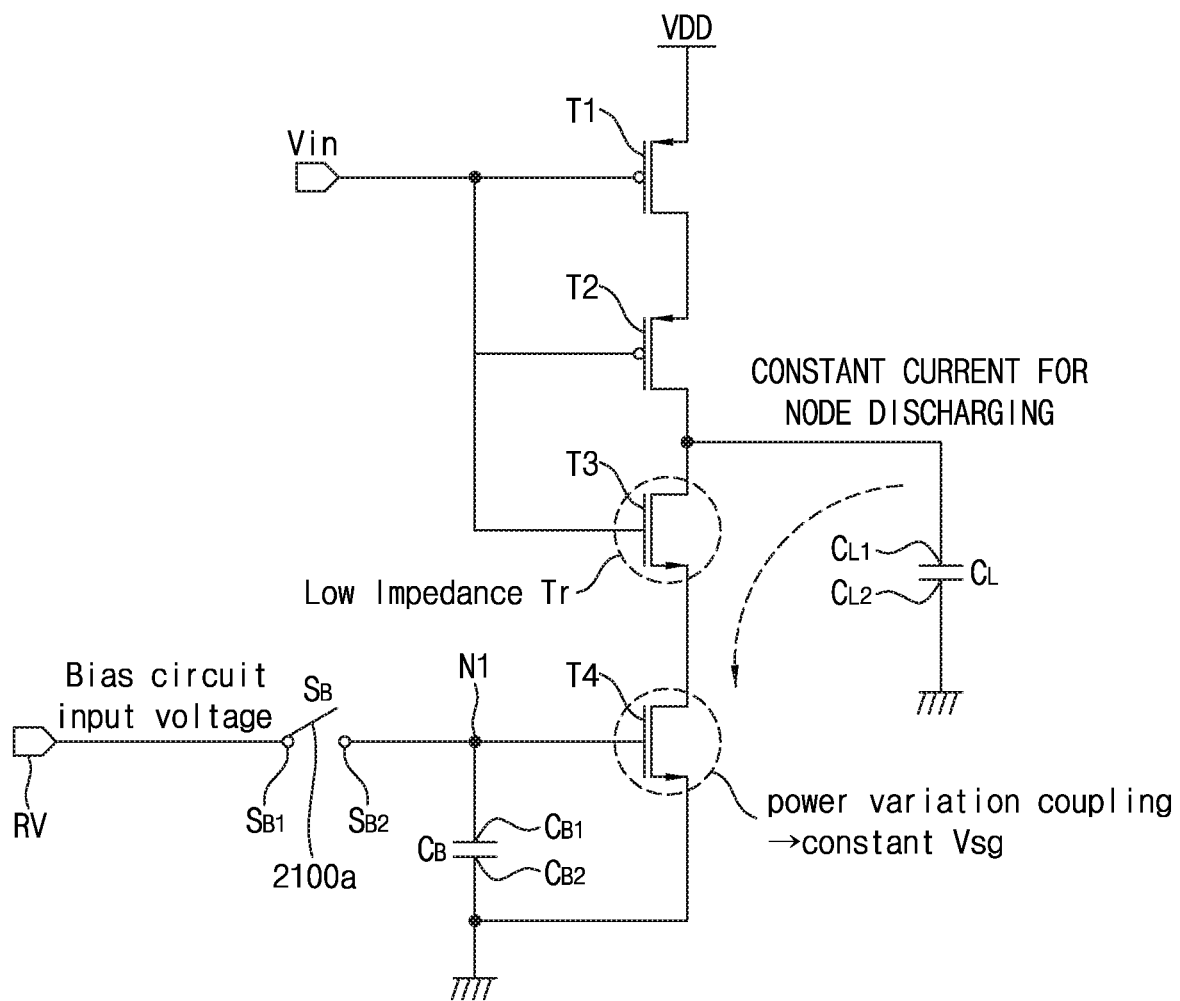
FIG. 9A illustrates a delay cell according to an exemplary embodiment of the present inventive concept and is a view illustrating an N-type delay cell.

FIG. 9A illustrates a delay cell according to an exemplary embodiment of the present inventive concept and is a view illustrating an N-type delay cell.

Referring to FIGS. 8A to 9A, each of the plurality of pulse generators 214a may include an N-type delay cell 2000c. The N-type delay cell 2000c includes a plurality of transistors T1 to T4, a plurality of capacitors $C_B$ and $C_L$, and a stabilization switch 2100a or $S_B$. Although the N-type delay cell 2000c is illustrated as including four transistors T1 to T4 in FIG. 9A, the present inventive concept is not limited thereto, and the number of transistors may be varied.

The plurality of transistors T1 to T4 may be connected to each other in series. As an example, a first transistor T1, a second transistor T2, a third transistor T3, and a fourth transistor T4 are connected to each other in series. As an example, each of the first transistor T1 and the second transistor T2 may be implemented as a P-MOS transistor. As an example, each of the third transistor T3 and the fourth transistor T4 may be implemented as an N-MOS transistor.

A first terminal $C_{B1}$ of a stabilization capacitor $C_B$, a gate terminal of the fourth transistor T4, and a second terminal $S_{B2}$ of a stabilization switch 2100 or $S_B$ are connected to a first node N1.

The first transistor T1 includes a first terminal to which a power voltage VDD is input and a second terminal that is connected to the second transistor T2. An input voltage Vin is applied to a gate terminal of the first transistor T1.

A first terminal of the second transistor T2 is connected to the second terminal of the first transistor T1. A second terminal of the second transistor T2 is connected to a second terminal of the third transistor T3 and a sampling capacitor $C_L$. The input voltage Vin is applied to a gate terminal of the second transistor T2.

A first terminal of the third transistor T3 is connected to a second terminal of a fourth transistor T4. The second terminal of the third transistor T3 is connected to the second terminal of the second transistor T2 and the sampling capacitor $C_L$. The input voltage Vin is applied to a gate terminal of the third transistor T3.

A first terminal $C_{L1}$ of the sampling capacitor $C_L$ is connected to the second terminal of the second transistor T2 and the second terminal of the third transistor T3. A second terminal $C_{L2}$ of the sampling capacitor $C_L$ is connected to a ground GND terminal.

A first terminal of the fourth transistor T4 is connected to the ground GND terminal. The second terminal of the fourth transistor T4 is connected to the first terminal of the third transistor T3. The stabilization capacitor $C_B$ is disposed between the gate terminal and the first terminal of the fourth transistor T4. The gate terminal of the fourth transistor T4 is connected to the second terminal $S_{B2}$ of the stabilization switch 2100 or $S_B$ and the first terminal $C_{B1}$ of the stabilization capacitor $C_B$.

The first terminal $C_{B1}$ of the stabilization capacitor $C_B$ may be connected to the gate terminal of the fourth transistor T4 and the second terminal $S_{B2}$ of the stabilization switch 2100a or $S_B$. A second terminal $C_{B2}$ of the stabilization capacitor $C_B$ may be connected to the ground GND terminal and the first terminal of the fourth transistor T4.

The gate terminal of the fourth transistor T4 is connected to the stabilization switch 2100a or $S_B$. A first terminal $S_{B1}$ of the stabilization switch 2100a or $S_B$ is connected to a reference voltage input terminal RV. A reference voltage (for example, a bias circuit input voltage) is input to the first terminal $S_{B1}$ of the stabilization switch 2100a or $S_B$. The second terminal $S_{B2}$ of the stabilization switch 2100a or $S_B$ is connected to the gate terminal of the fourth transistor T4.

As an example, the first transistor T1 has a first impedance value. In an exemplary embodiment, the second transistor T2 has a second impedance lower than an impedance of the first transistor T1.

As an example, the third transistor T3 has a third impedance value. In an embodiment, the second transistor T2 has a second impedance lower than an impedance of the third transistor T3. In an exemplary embodiment, the first impedance value is the same the third impedance value.

The stabilization switch 2100a or $S_B$ may maintain an on-state or an off-state on the basis of an input bias control signal BIAS_IN ($S_B$).

As an example, the stabilization switch 2100a or $S_B$ is turned on when the bias control signal BIAS_IN ($S_B$) is input, and the stabilization switch 2100a or $S_B$ is turned off when the bias control signal BIAS_IN ($S_B$) is not input.

As an example, the stabilization switch 2100a or $S_B$ is turned off when the bias control signal BIAS_IN ($S_B$) is input, and the stabilization switch 2100a or $S_B$ is turned on when the bias control signal BIAS_IN ($S_B$) is not input.

The gate terminal of the fourth transistor T4, the first terminal $C_{B1}$ of the stabilization capacitor $C_B$, and the second terminal $S_{B2}$ of the stabilization switch 2100a or $S_B$ are connected to each other at the first node N1.

When the stabilization switch 2100a or $S_B$ is turned on, the reference voltage (for example, the bias circuit input voltage) is supplied to the first node N1. In an exemplary embodiment, the stabilization switch 2100a or $S_B$ maintains an on-state before a reset signal is output so that the reference voltage (for example, the bias circuit input voltage) is supplied to the first node N1, and the stabilization switch 2100a or $S_B$ maintains an off-state during a period in which the reset signal is output.

In an exemplary embodiment, the stabilization switch 2100a or $S_B$ maintains an on-state before a pulse signal PULSE_OUT is output so that the reference voltage (for example, the bias circuit input voltage) is supplied to the first node N1, and the stabilization switch 2100a or $S_B$ maintains an off-state during a period in which the pulse signal PULSE_OUT is output.

Thus, Vgs or Vsg of the fourth transistor T4 connected to the first node N1 may be constantly maintained so that a constant current flows regardless of variations of the power voltage VDD and a ground GND. The N-type delay cell 2000c may generate and output the pulse signal PULSE_OUT having a small delay difference by ensuring a constant current charging/discharging.

Figure 9B:
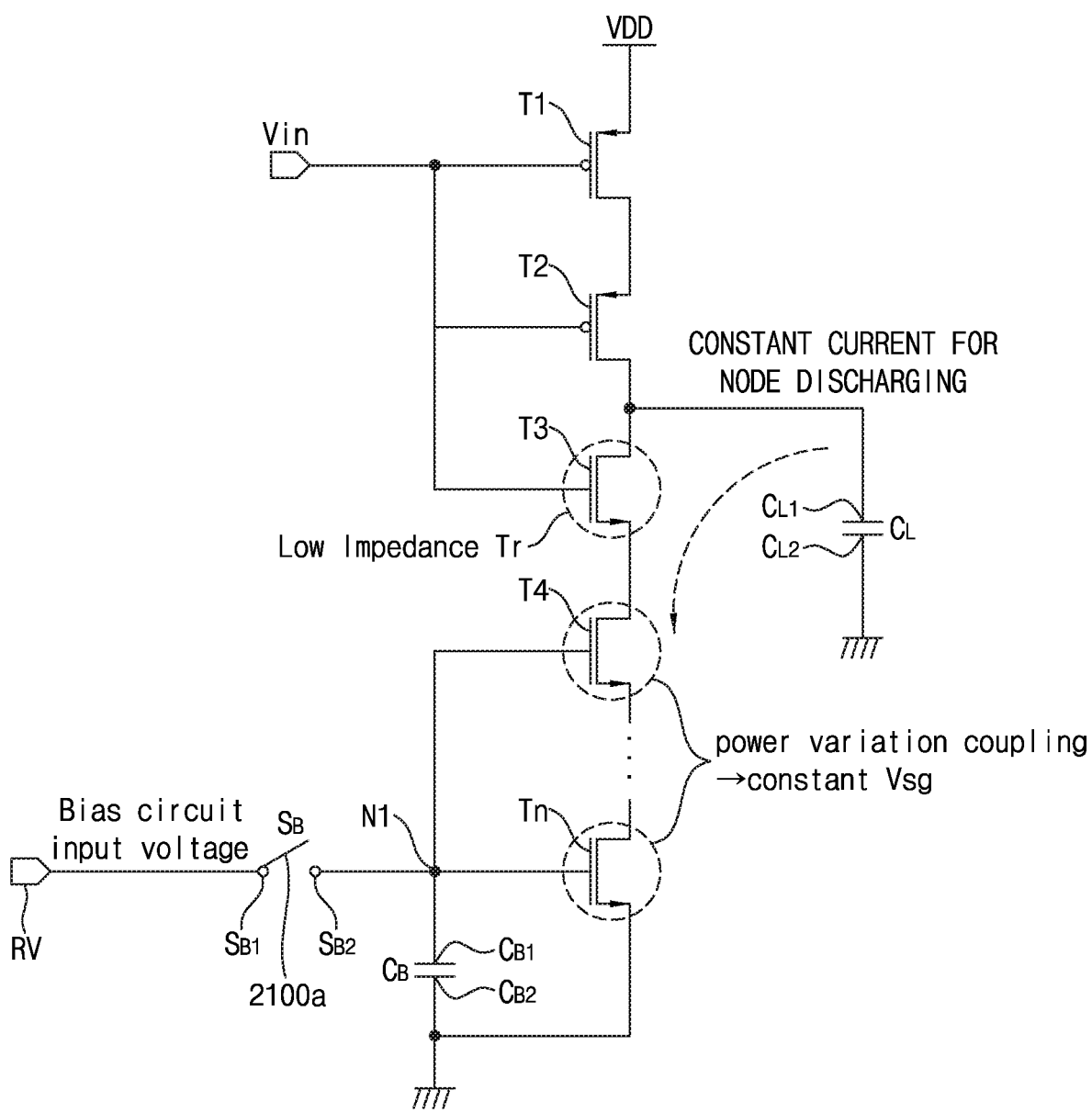
FIG. 9B illustrates a delay cell according to an exemplary embodiment of the present inventive concept and is a view illustrating an N-type delay cell.

FIG. 9B illustrates a delay cell according to an exemplary embodiment of the present inventive concept and is a view illustrating an N-type delay cell. In describing a delay cell 2000d shown in FIG. 9B, the description of the same configuration as the delay cell 2000c described with reference to FIG. 9A may be omitted.

Referring to FIG. 9B, each of the plurality of pulse generators 214a may include an N-type delay cell 2000d.

The N-type delay cell 2000d includes a plurality of transistors T1 to Tn, a plurality of capacitors $C_B$ and $C_L$, and a stabilization switch 2100a or $S_B$. Although the N-type delay cell 2000d is illustrated as including n transistors T1 to Tn in FIG. 9B, the present inventive concept is not limited thereto, and the number of transistors may be varied.

In FIG. 9A, the N-type delay cell 2000c is shown in which one transistor, that is, the fourth transistor T4, is connected to the first node N1. In FIG. 9B, the N-type delay cell 2000d is shown in which a plurality of transistors T4 to Tn are connected to a first node N1.

The plurality of transistors T1 to Tn may be connected to each other in series. As an example, a first transistor T1 to an n-th transistor Tn are connected to each other in series. As an example, each of the first transistor T1 and a second transistor T2 may be implemented by a P-MOS transistor. As an example, each of third to n-th transistors T3 to Tn may be implemented by an N-MOS transistor.

A first terminal $C_{B1}$ of a stabilization capacitor $C_B$, a second terminal $S_{B2}$ of a stabilization switch 2100a or $S_B$, and gate terminals of a fourth transistor T4 to the n-th transistor Tn are connected to the first node N1. That is, the gate terminals of the plurality of transistors T4 to Tn are connected to the first node N1.

When the stabilization switch 2100a or $S_B$ is turned on, a reference voltage (for example, a bias circuit input voltage) is supplied to the first node N1.

In an exemplary embodiment, the stabilization switch 2100a or $S_B$ maintains an on-state before a reset signal is output so that the reference voltage (for example, the bias circuit input voltage) is supplied to the first node N1, and the stabilization switch 2100a or $S_B$ maintains an off-state during a period in which the reset signal is output.

In an exemplary embodiment, the stabilization switch 2100a or $S_B$ maintains an on-state before a pulse signal PULSE_OUT is output so that the reference voltage (for example, the bias circuit input voltage) is supplied to the first node N1, and the stabilization switch 2100a or $S_B$ maintains an off-state during a period in which the pulse signal PULSE_OUT is output.

Vgs or Vsg of the plurality of transistors T4 to Tn connected to the first node N1 may be constantly maintained. That is, Vgs or Vsg of the fourth transistor T4 to the n-th transistor Tn may be constantly maintained. Thus, a constant current may flow regardless of variations of a power voltage VDD and a ground GND. A constant current charging/discharging may be ensured in the N-type delay cell 2000d. The plurality of pulse generators 214a may generate and output the pulse signal PULSE_OUT having a small delay difference.

Figure 9C:
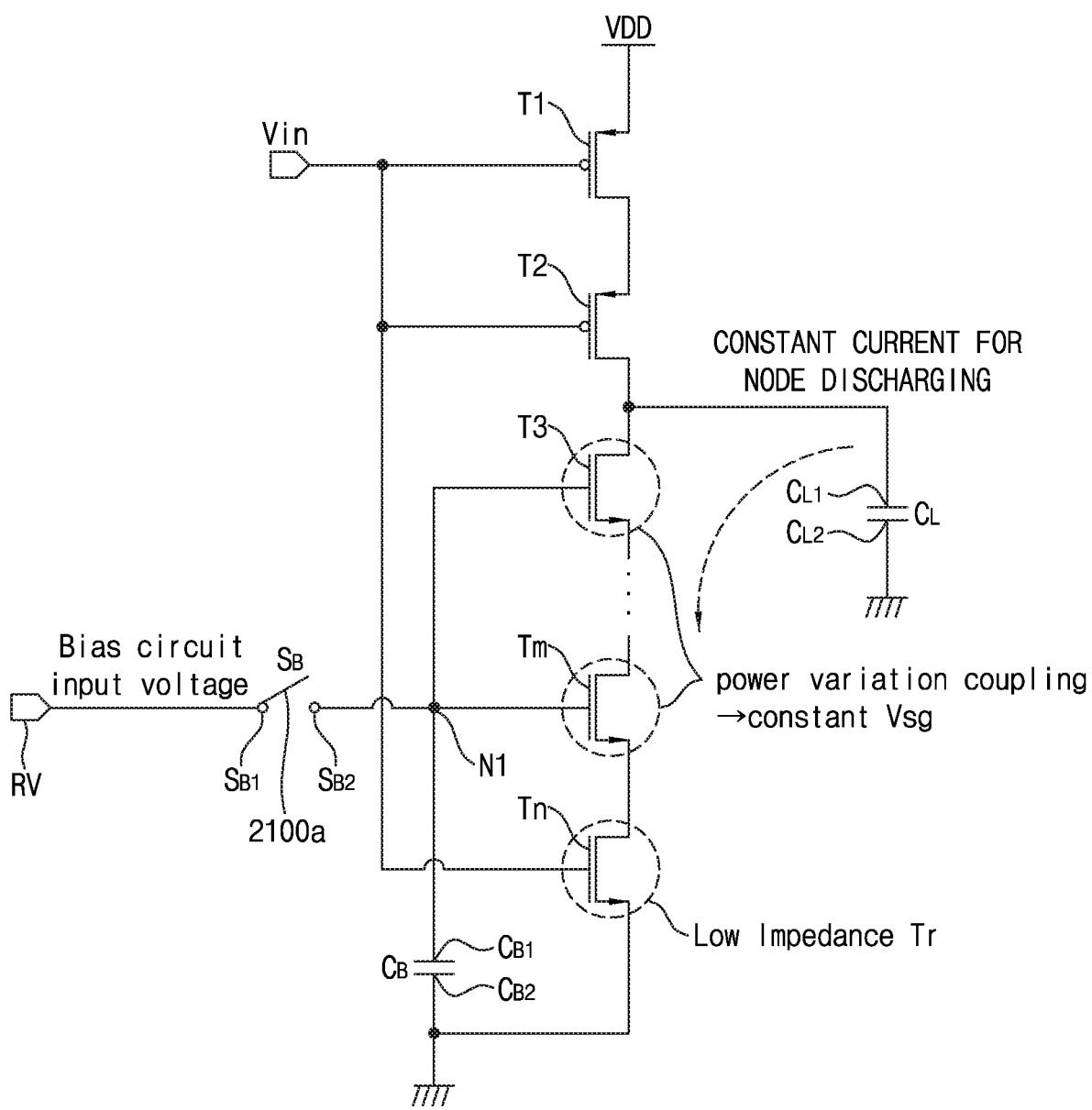
FIG. 9C illustrates a delay cell according to an exemplary embodiment of the present inventive concept and is a view illustrating an N-type delay cell.

FIG. 9C illustrates a delay cell according to an exemplary embodiment of the present inventive concept and is a view illustrating an N-type delay cell. In describing a delay cell 2000e shown in FIG. 9C, the description of the same configuration as the delay cell 2000c described with reference to FIG. 9A may be omitted.

Referring to FIG. 9C, each of the plurality of pulse generators 214a may include an N-type delay cell 2000e. The N-type delay cell 2000e includes a plurality of transistors T1 to Tn, a plurality of capacitors $C_B$ and $C_L$, and a stabilization switch 2100a. Although the N-type delay cell 2000e is illustrated as including n transistors T1 to Tn in FIG. 9C, the present inventive concept is not limited thereto, and the number of transistors may be varied.

In FIG. 9A, the N-type delay cell 2000c is shown in which one transistor, that is, the fourth transistor T4, is connected to the first node N1. In FIG. 9C, the N-type delay cell 2000e is shown in which a plurality of transistors T3 to Tn are connected to a first node N1.

The plurality of transistors T1 to Tn may be connected to each other in series. As an example, a first transistor T1 to an n-th transistor Tn are connected to each other in series. As an example, each of the first transistor T1 and a second transistor T2 may be implemented by a P-MOS transistor. As one example, each of a third transistor T3 to the n-th transistor Tn may be implemented by a N-MOS transistor.

A first terminal $C_{B1}$ of a stabilization capacitor $C_B$, a second terminal $S_{B2}$ of the stabilization switch 2100a or $S_B$, and gate terminals of the third transistor T3 to an m-th transistor Tm are connected to the first node N1. That is, the gate terminals of the plurality of transistors T3 to Tm are connected to the first node N1.

A gate terminal of the n-th transistor Tn disposed last (at an end) among the N-MOS transistors is connected to a gate terminal of the first transistor T1 and a gate terminal of the second transistor T2. The gate terminal of the n-th transistor Tn disposed last (at the end) among the N-MOS transistors is not connected to the first node N1. An input voltage Vin is applied to the gate terminal of the n-th transistor Tn.

A first terminal of the n-th transistor Tn may be connected to a second terminal $C_{B2}$ of the stabilization capacitor $C_B$ and a ground GND terminal. A second terminal of the n-th transistor Tn may be connected to a first terminal of the m-th transistor Tm.

The first transistor T1 includes a first terminal to which a power voltage VDD is input and a second terminal connected to the second transistor T2. The input voltage Vin is applied to the gate terminal of the first transistor T1.

A first terminal of the second transistor T2 is connected to the second terminal of the first transistor T1. A second terminal of the second transistor T2 is connected to a first terminal of the third transistor T3 and a first terminal $C_{L1}$ of a sampling capacitor $C_L$. The input voltage Vin is applied to the gate terminal of the second transistor T2.

The first terminal $C_{B1}$ of the stabilization capacitor $C_B$ is connected to the gate terminals of the third transistor T3 to the m-th transistor Tm. The first terminal $C_{B1}$ of the stabilization capacitor $C_B$ is connected to the second terminal $S_{B2}$ of the stabilization switch 2100a or $S_B$. The second terminal $C_{B2}$ of the stabilization capacitor $C_B$ is connected to the ground GND terminal and the first terminal of the n-th transistor Tn.

The gate terminals of the third transistor T3 to the m-th transistor Tm are connected to the second terminal $S_{B2}$ of the stabilization switch 2100a or $S_B$ and the first terminal $C_{B1}$ of the stabilization capacitor $C_B$. That is, the gate terminals of the third transistor T3 to the m-th transistor Tm are connected to the first node N1.

The input voltage Vin is applied to the gate terminals of the first transistor T1, the second transistor T2, and the n-th transistor Tn.

When the stabilization switch 2100a or $S_B$ is turned on, a reference voltage (for example, a bias circuit input voltage) is supplied to the first node N1.

In an exemplary embodiment, the stabilization switch 2100a or $S_B$ maintains an on-state before a reset signal is output so that the reference voltage (for example, the bias circuit input voltage) is supplied to the first node N1, and the stabilization switch 2100a or $S_B$ maintains an off-state during a period in which the reset signal is output.

In an exemplary embodiment, the stabilization switch 2100a or $S_B$ maintains an on-state before a pulse signal PULSE_OUT is output so that the reference voltage (for example, the bias circuit input voltage) is supplied to the first node N1, and the stabilization switch 2100a or $S_B$ maintains an off-state during a period in which the pulse signal PULSE_OUT is output.

Vgs or Vsg of the plurality of transistors T3 to Tm connected to the first node N1 may be constantly maintained. That is, Vgs or Vsg of the third transistor T3 to the m-th transistor Tm may be constantly maintained. Thus, a constant current may flow regardless of variations of the power voltage VDD and a ground GND. A constant current charging/discharging may be ensured in the N-type delay cell 2000e. The plurality of pulse generators 214a may generate and output the pulse signal PULSE_OUT having a small delay difference.

Figure 10:
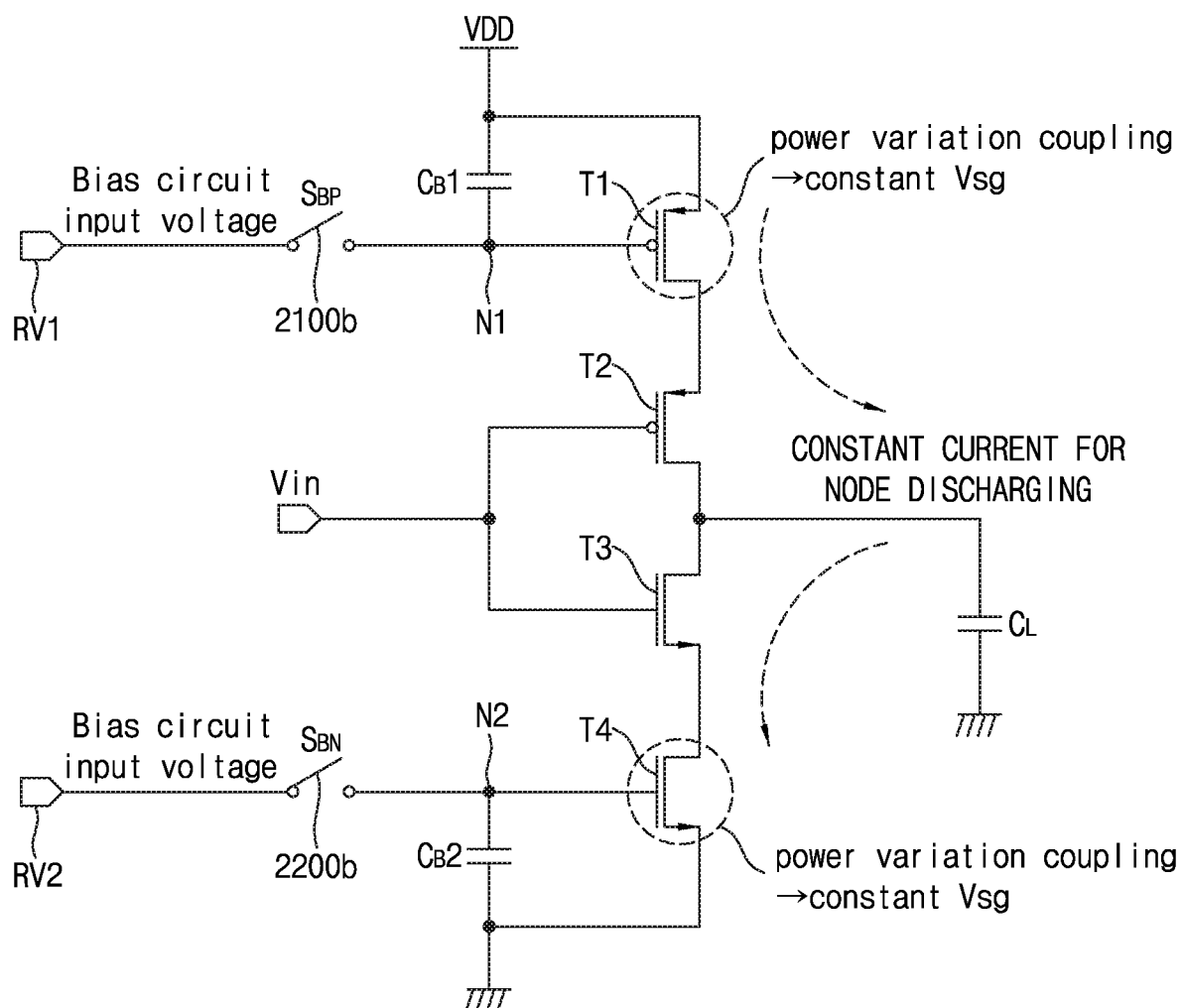
FIG. 10 illustrates a delay cell according to an exemplary embodiment of the present inventive concept and is a view illustrating a P-N-type delay cell.

FIG. 10 illustrates a delay cell according to an exemplary embodiment of the present inventive concept and is a view illustrating a P-N-type delay cell.

Referring to FIGS. 8A, 8B, and 10, a P-N-type delay cell 2000f may be formed by combining the P-type delay cell 2000 shown in FIG. 7A and the N-type delay cell 2000c shown in FIG. 9A.

Each of the plurality of pulse generators 214a may include the P-N-type delay cell 2000f. The P-N-type delay cell 2000f includes a plurality of transistors T1 to T4, a plurality of capacitors $C_B1$, $C_B2$, and $C_L$, and a plurality of stabilization switches 2100b and 2200b. Although the P-N-type delay cell 2000f is illustrated as including four transistors T1 to T4 in FIG. 10, the present inventive concept is not limited thereto, and the number of transistors may be varied.

The plurality of transistors T1 to T4 may be connected to each other in series. As one example, a first transistor T1, a second transistor T2, a third transistor T3, and a fourth transistor T4 are connected to each other in series. As an example, each of the first transistor T1 and the second transistor T2 may be implemented by a P-MOS transistor. As an example, each of the third transistor T3 and the fourth transistor T4 may be implemented by an N-MOS transistor.

The first transistor T1 includes a first terminal to which a power voltage VDD is input and a second terminal that is connected to the second transistor T2. A first stabilization capacitor $C_B1$ is disposed between a gate terminal and the first terminal of the first transistor T1. A first terminal of the first stabilization capacitor $C_B 1$ is connected to the gate terminal of the first transistor T1 and a second terminal of a first stabilization switch 2100b or $S_{BP}$. A second terminal of the first stabilization capacitor $C_B 1$ is connected to a power voltage VDD terminal and the first terminal of the first transistor T1.

The gate terminal of the first transistor T1 is connected to the first stabilization switch 2100b or $S_{BP}$. A first terminal of the first stabilization switch 2100b or $S_{BP}$ is connected to a first reference voltage input terminal RV1. A first reference voltage (for example, a bias circuit input voltage) is input to the first terminal of the first stabilization switch 2100b or $S_{BP}$. The second terminal of the first stabilization switch 2100b or $S_{BP}$ is connected to the gate terminal of the first transistor T1.

The first stabilization switch 2100b or $S_{BP}$ may maintain an on-state or off-state on the basis of an input bias control signal BIAS_IN ($S_B$).

As an example, the first stabilization switch 2100b or $S_{BP}$ is turned on when the bias control signal BIAS_IN ($S_B$) is input, and the first stabilization switch 2100b or $S_{BP}$ is turned off when the bias control signal BIAS_IN ($S_B$) is not input.

As an example, the first stabilization switch 2100b or $S_{BP}$ is turned off when the bias control signal BIAS_IN ($S_B$) is input, and the first stabilization switch 2100b or $S_BP$ is turned on when the bias control signal BIAS_IN ($S_B$) is not input.

The gate terminal of the first transistor T1, the first terminal of the first stabilization capacitor $C_B1$, and the second terminal of the first stabilization switch 2100b or $S_BP$ are connected to each other at the first node N1.

When first stabilization switch 2100b or $S_BP$ is turned on, the first reference voltage (for example, the bias circuit input voltage) is supplied to the first node N1. In an exemplary embodiment, the first stabilization switch 2100b or $S_{BP}$ maintains an on-state before a reset signal is output so that the first reference voltage (for example, the bias circuit input voltage) is supplied to the first node N1, and the first stabilization switch 2100b or $S_{BP}$ maintains an off-state during a period in which the reset signal is output.

In an exemplary embodiment, the first stabilization switch 2100b or $S_{BP}$ maintains an on-state before a pulse signal PULSE_OUT is output so that the first reference voltage (for example, the bias circuit input voltage) is supplied to the first node N1, and the first stabilization switch 2100b or $S_{BP}$ maintains an off-state during a period in which the pulse signal PULSE_OUT is output.

Thus, Vgs or Vsg of the first transistor T1 connected to the first node N1 may be constantly maintained so that a constant current flows regardless of variations of the power voltage VDD and a ground GND.

A first terminal of the second transistor T2 is connected to the second terminal of the first transistor T1. A second terminal of the second transistor T2 is connected to a first terminal of the third transistor T3 and a sampling capacitor $C_L$. An input voltage Vin is applied to a gate terminal of the second transistor T2.

The first terminal of the third transistor T3 is connected to the second terminal of the second transistor T2 and the sampling capacitor $C_L$. A second terminal of the third transistor T3 is connected to a first terminal of the fourth transistor T4. The input voltage Vin is applied to a gate terminal of the third transistor T3.

A first terminal of the sampling capacitor $C_L$ may be connected to the second terminal of the second transistor T2 and the first terminal of the third transistor T3. A second terminal of the sampling capacitor $C_L$ may be connected to a ground GND terminal.

The first terminal of the fourth transistor T4 is connected to the second terminal of the third transistor T3. A second terminal of the fourth transistor T4 is connected to the ground GND terminal. A second stabilization capacitor $C_B2$ is disposed between a gate terminal and the second terminal of the fourth transistor T4.

A first terminal of the second stabilization capacitor $C_B2$ is connected to the gate terminal of the fourth transistor T4 and a second terminal of a second stabilization switch 2200b or $S_{BN}$. A second terminal of the second stabilization capacitor $C_B2$ is connected to the ground GND terminal and the second terminal of the fourth transistor T4.

The gate terminal of the fourth transistor T4 is connected to the second stabilization switch 2200b or $S_{BN}$. A first terminal of the second stabilization switch 2200b or $S_{BN}$ is connected to a second reference voltage input terminal RV2. A second reference voltage (for example, a bias circuit input voltage) is input to the first terminal of the second stabilization switch 2200b or $S_B$. The second terminal of the second stabilization switch 2200b or $S_{BN}$ is connected to the gate terminal of the fourth transistor T4.

As an example, the first transistor T1 has a first impedance value. In an exemplary embodiment, the second transistor T2 has a second impedance lower than an impedance of the first transistor T1

As an example, the third transistor T3 has a third impedance value. In an exemplary embodiment, the second transistor T2 has a second impedance lower than an impedance of the third transistor T3. In an exemplar embodiment, the first impedance value is the same as the third impedance value.

The second stabilization switch 2200b or $S_{BN}$ may maintain an on-state or off-state on the basis of the input bias control signal BIAS_IN ($S_B$).

As an example, the second stabilization switch 2200b or $S_{BN}$ is turned on when the bias control signal BIAS_IN ($S_B$) is input, and the second stabilization switch 2200b or $S_{BN}$ is turned off when the bias control signal BIAS_IN ($S_B$) is not input.

As an example, the second stabilization switch 2200b or $S_{BN}$ is turned off when the bias control signal BIAS_IN ($S_B$) is input, and the second stabilization switch 2200b or $S_{BN}$ is turned on when the bias control signal BIAS_IN ($S_B$) is not input.

The gate terminal of the fourth transistor T4, the first terminal of the second stabilization capacitor $C_B2$, and the second terminal of the second stabilization switch 2200b or $S_{BN}$ are connected to each other at a second node N2.

When the second stabilization switch 2200b or $S_{BN}$ is turned on, the second reference voltage (for example, the bias circuit input voltage) is supplied to the second node N2. In an exemplary embodiment, the second stabilization switch 2200b or $S_{BN}$ maintains an on-state before a reset signal is output so that the second reference voltage (for example, the bias circuit input voltage) is supplied to the second node N2, and the second stabilization switch 2200b or $S_{BN}$ maintains an off-state during a period in which the reset signal is output.

In an exemplary embodiment, the second stabilization switch 2200b or $S_{BN}$ maintains an on-state before a pulse signal PULSE_OUT is output so that the second reference voltage (for example, the bias circuit input voltage) is supplied to the second node N2, and the second stabilization switch 2200b or $S_{BN}$ maintains an off-state during a period in which the pulse signal PULSE_OUT is output.

Thus, Vgs or Vsg of the fourth transistor T4 connected to the second node N2 may be constantly maintained so that a constant current flows regardless of variations of the power voltage VDD and the ground GND. A constant current charging/discharging may be ensured by constantly maintaining Vgs or Vsg of each of the first transistor T1 disposed first (the transistor connected to the first node N1) and the fourth transistor T4 disposed at an end (the transistor connected to the second node N2) among the plurality of transistors disposed in the P—N-type delay cell 2000f. A pulse generator 214a including the P-N-type delay cell 2000f may generate and output the pulse signal PULSE_OUT having a small delay difference In an exemplary embodiment, the first reference voltage and the second reference voltage are supplied at the same time.

In an alternate embodiment, the first reference voltage and the second reference voltage are supplied at different times.

As an example, the first reference voltage input terminal RV1 and the second reference voltage input terminal RV2 may be integrated into one terminal.

In an exemplary embodiment, the first reference voltage and the second reference voltage have the same voltage value.

In an alternate embodiment, the first reference voltage and the second reference voltage have different voltage values.

As an example, the P-N-type delay cell may be formed by combining the P-type delay cell 2000a shown in FIG. 7B and the N-type delay cell 2000d shown in FIG. 9B.

As an example, the P-N-type delay cell may be formed by combining the P-type delay cell 2000b shown in FIG. 7C and the N-type delay cell 2000e shown in FIG. 9C.

FIGS. 11A to 11D are views illustrating multi-stage delay cells according to an exemplary embodiment of the present inventive concept.

Figure 11A:
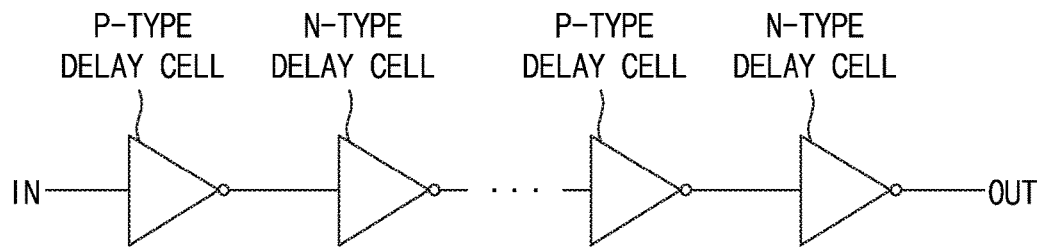
FIGS. 11A to 11D are views illustrating multi-stage delay cells according to an exemplary embodiment of the present inventive concept.

As shown in FIG. 11A, a plurality of P-type delay cells and a plurality of N-type delay cells may be alternately connected to each other in series to form a pulse generator 214a. The plurality of P-type delay cells and the plurality of N-type delay cells may be alternately connected to each other in series to adjust a delay time of a pulse signal PULSE_OUT.

Figure 11B:
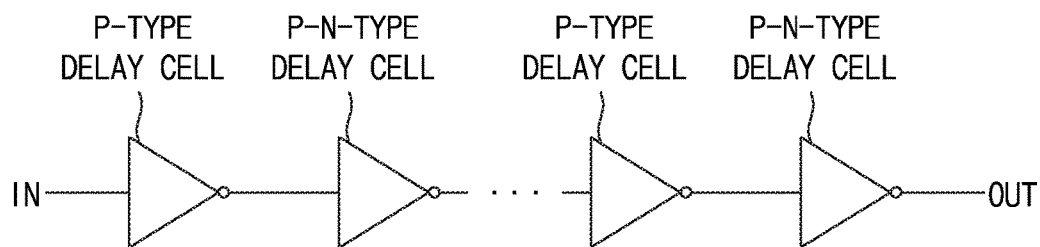

As shown in FIG. 11B, a plurality of P-type delay cells and a plurality of P-N-type delay cells may be alternately connected to each other in series to form a pulse generator 214a. The plurality of P-type delay cells and the plurality of P-N-type delay cells may be connected to each other in series to adjust a delay time of a pulse signal PULSE_OUT.

Figure 11C:
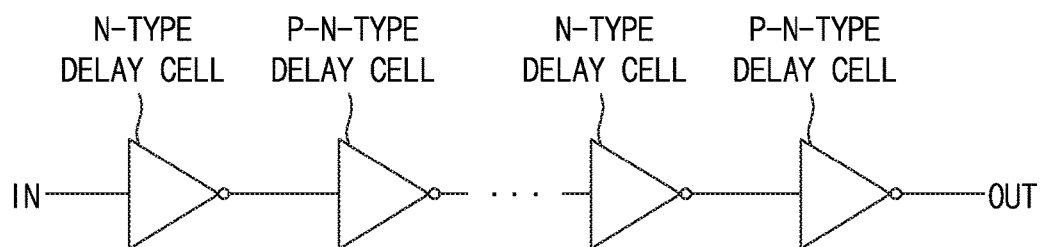

As shown in FIG. 11C, a plurality of N-type delay cells and a plurality of P-N-type delay cells may be alternately connected to each other in series to form a pulse generator 214a. The plurality of N-type delay cells and the plurality of P-N-type delay cells may be connected to each other in series to adjust a delay time of a pulse signal PULSE_OUT.

Figure 11D:
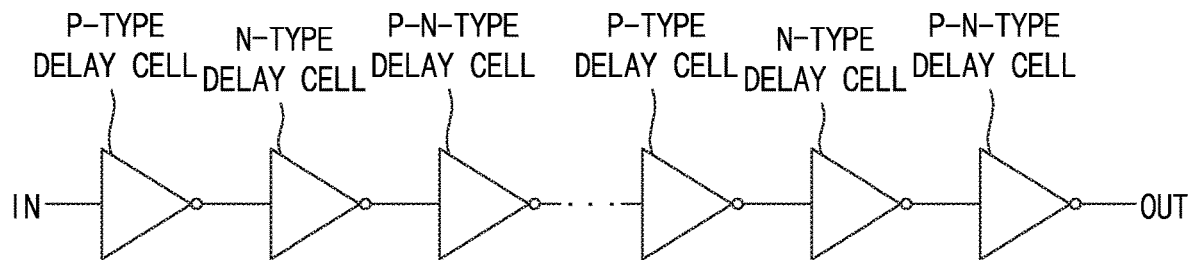

As shown in FIG. 11D, a plurality of P-type delay cells, a plurality of N-type delay cells, and a plurality of P-N-type delay cells may be alternately connected to each other in series to form a pulse generator 214a. The plurality of P-type delay cells, the plurality of N-type delay cells, and the plurality of P-N-type delay cells may be alternately connected to each other in series to adjust a delay time of a pulse signal PULSE_OUT.

Figure 12:
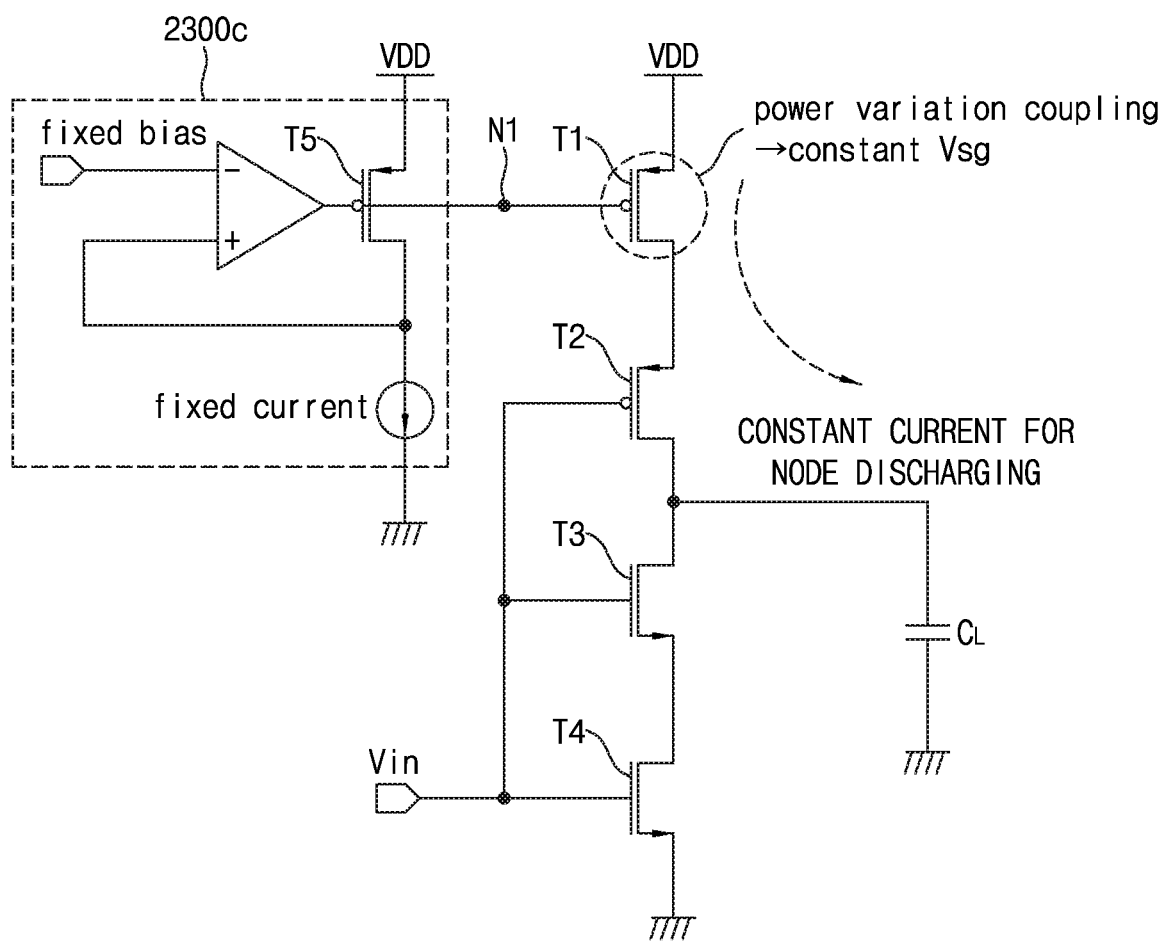
FIG. 12 illustrates a delay cell according to an exemplary embodiment of the present inventive concept and is a view illustrating a P-type delay cell.

FIG. 12 illustrates a delay cell according to an exemplary embodiment of the present inventive concept and is a view illustrating a P-type delay cell.

Referring to FIG. 12, in a delay cell 2000g according to an exemplary embodiment of the present inventive concept, a bias circuit 2300c of a regulator is applied instead of the stabilization switch 2100 of the P-type delay cell 2000 shown in FIG. 7A. The bias circuit 2300c includes an operational amplifier (op-amp) and a bias transistor (for example, a fifth transistor T5).

A power voltage VDD is input to a first terminal of the bias transistor T5. A second terminal of the bias transistor T5 is connected to a positive input terminal of the op-amp. A gate terminal of the bias transistor T5 is connected to an output terminal of the op-amp. The output terminal of the op-amp is connected to the gate terminal of the first transistor T1.

A reference voltage (for example, a fixed bias voltage) is applied to a negative input terminal of the op-amp. The gate terminal of the first transistor T1, the gate terminal of the bias transistor T5, and the output terminal of the op-amp are connected to each other.

A change between the power voltage and the ground (VDD/GND), which is input to a first terminal (for example, source terminal) of the first transistor T1 and the first terminal (for example, source terminal) of the bias transistor T5, may be transferred to a bias voltage (at the gate terminal) of the bias transistor T5.

When the change between the power voltage and the ground (VDD/GND) occurs, the op-amp may supply the reference voltage to a first node N1. By supplying the reference voltage to the first node N1, a voltage at the first node N1 to which the gate terminal of the first transistor T1 is connected may be constantly maintained. Thus, Vgs or Vsg of the first transistor T1 connected to the first node N1 may be constantly maintained so that a constant current charging/discharging is ensured. A pulse generator 214a including the P-type delay cell 2000g may generate and output a pulse signal PULSE_OUT having a small delay difference.

Figure 13:
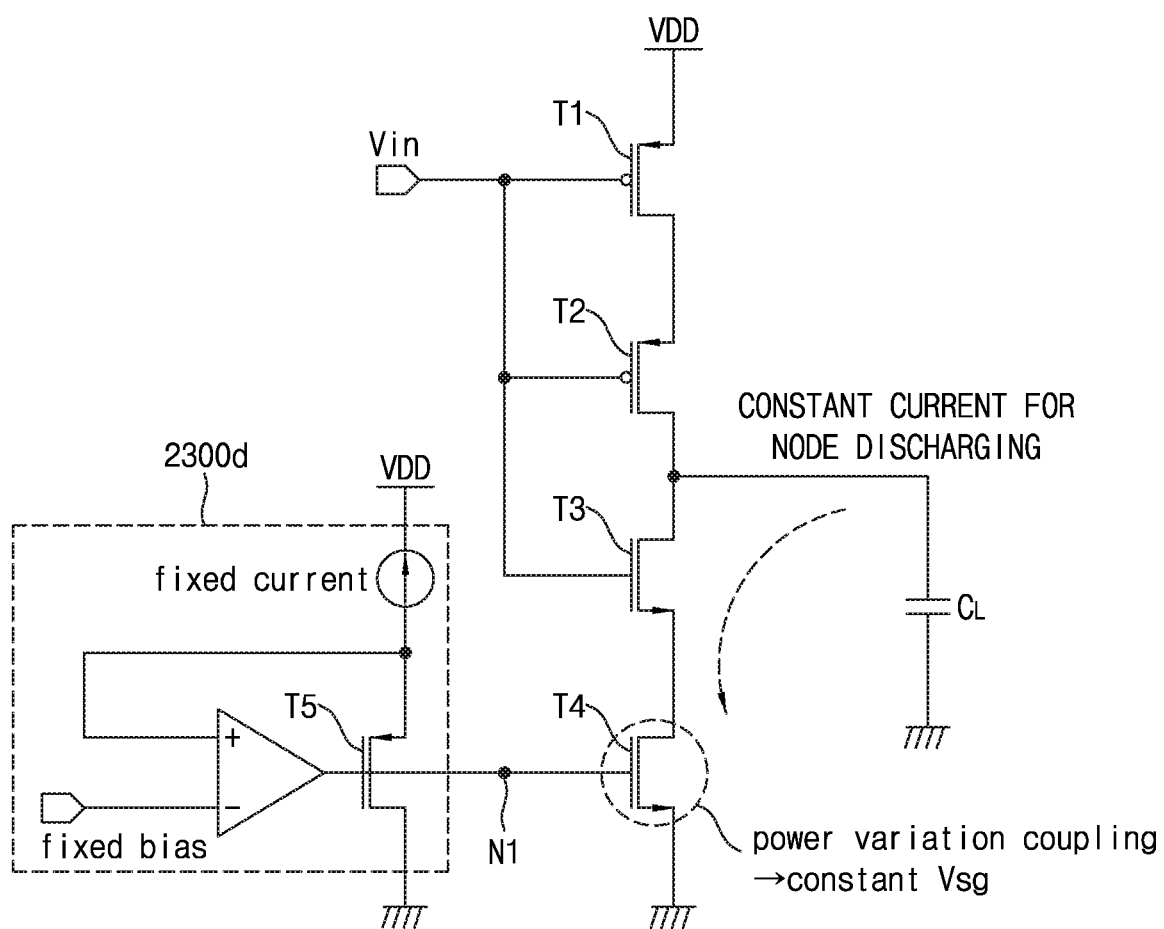
FIG. 13 illustrates a delay cell according to an exemplary embodiment of the present inventive concept and is a view illustrating an N-type delay cell.

FIG. 13 illustrates a delay cell according to an exemplary embodiment of the present inventive concept and is a view illustrating an N-type delay cell.

Referring to FIG. 13, in a delay cell 2000h according to an exemplary embodiment of the present inventive concept, a bias circuit 2300d of a regulator is applied instead of the stabilization switch 2100a of the N-type delay cell 2000c shown in FIG. 9A. The bias circuit 2300d includes an op-amp and a bias transistor (for example, a fifth transistor T5).

A power voltage VDD is input to a first terminal of the bias transistor T5. The first terminal of the bias transistor T5 is connected to a positive input terminal of the op-amp. A second terminal of the bias transistor T5 is connected to a ground GND terminal. A gate terminal of the bias transistor T5 is connected to an output terminal of the op-amp. A reference voltage (for example, a fixed bias voltage) is applied to a negative input terminal of the op-amp. A gate terminal of a fourth transistor T4, the gate terminal of the bias transistor T5, and the output terminal of the op-amp are connected to each other. The output terminal of the op-amp is connected to the gate terminal of the fourth transistor T4.

A change between the power voltage and a ground (VDD/GND), which is input to a first terminal (for example, source terminal) of the fourth transistor T4 and the first terminal (for example, source terminal) of the bias transistor T5, may be transferred to a bias voltage (at the gate terminal) of the bias transistor T5.

When the change between the power voltage and the ground (VDD/GND) occurs, the op-amp may supply the reference voltage to a first node N1. By supplying the reference voltage to the first node N1, a voltage at the first node N1 to which the gate terminal of the fourth transistor T4 is connected may be constantly maintained. Thus, Vgs or Vsg of the fourth transistor T4 connected to the first node N1 may be constantly maintained so that a constant current charging/discharging is ensured. A pulse generator 214a including the N-type delay cell 2000h may generate and output a pulse signal PULSE_OUT having a small delay difference.

Figure 14:
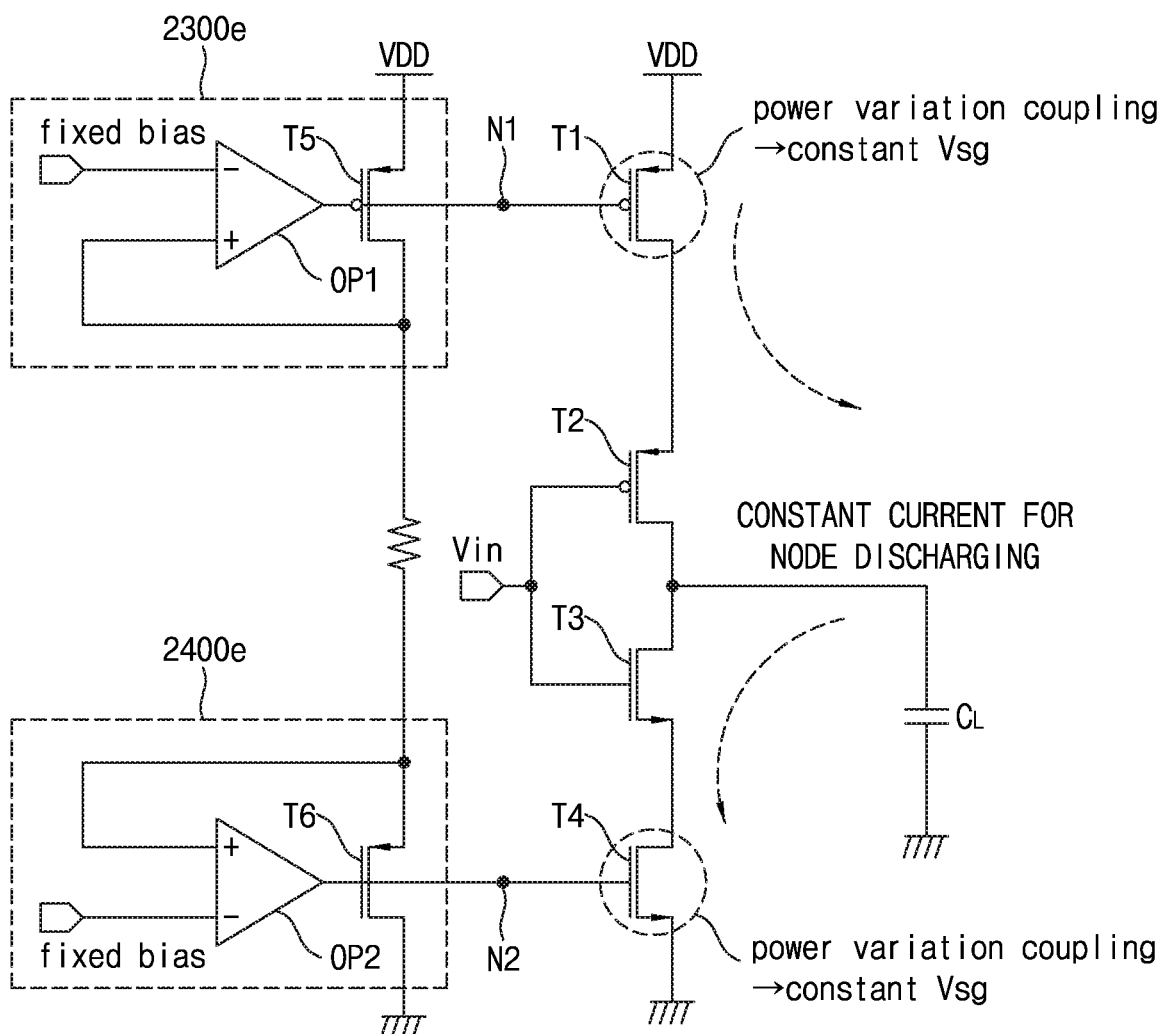
FIG. 14 illustrates a delay cell according to an exemplary embodiment of the present inventive concept and is a view illustrating a P-N-type delay cell.

FIG. 14 illustrates a delay cell according to one exemplary embodiment of the present inventive concept and is a view illustrating a P-N-type delay cell.

Referring to FIG. 14, in a delay cell 2000i according to an exemplary embodiment of the present inventive concept, a first bias circuit 2300e of a regulator is applied instead of the first stabilization switch 2100b of the P-N-type delay cell 2000f shown in FIG. 10. The first bias circuit 2300e includes a first op-amp OP1 and a first bias transistor (for example, a fifth transistor T5).

In the delay cell 2000i according to an exemplary embodiment of the present inventive concept, a second bias circuit 2400e of a regulator is applied instead of the second stabilization switch 2200b of the P-N-type delay cell 2000f shown in FIG. 10. The second bias circuit 2400e includes a second op-amp OP2 and a second bias transistor (for example, a sixth transistor T6).

A power voltage VDD is input to a first terminal of the first bias transistor T5 of the first bias circuit 2300e. A second terminal of the first bias transistor T5 is connected to a positive input terminal of the first op-amp OP1. The second terminal of the first bias transistor T5 is connected to a first terminal of the second bias transistor T6. Here, a resistor may be disposed between the second terminal of the first bias transistor T5 and the first terminal of the second bias transistor T6.

A gate terminal of the first bias transistor T5 is connected to an output terminal of the first op-amp OP1. A reference voltage (for example, a fixed bias voltage) is applied to a negative input terminal of the first op-amp OP1. A gate terminal of a first transistor T1, the gate terminal of the first bias transistor T5, and the output terminal of the first op-amp OP1 are connected to each other. The output terminal of the first op-amp OP1 is connected to the gate terminal of the first transistor T1.

A change between the power voltage and a ground (VDD/GND), which is input to a first terminal (for example, source terminal) of the first transistor T1 and the first terminal (for example, source terminal) of the first bias transistor T5, may be transferred to a bias voltage (at the gate terminal) of the first bias transistor T5.

A voltage at a first node N1 to which the gate terminal of the first transistor T1 is connected may be constantly maintained. Thus, Vgs or Vsg of the first transistor T1 connected to the first node N1 may be constantly maintained so that a constant current charging/discharging is ensured.

The first terminal of the second bias transistor T6 of the second bias circuit 2400e is connected to the second terminal of the first bias transistor T5. The first terminal of the second bias transistor T6 is connected to a positive input terminal of the second op-amp OP2. A second terminal of the second bias transistor T6 is connected to a ground GND terminal.

A gate terminal of the second bias transistor T6 is connected to an output terminal of the second op-amp OP2. A reference voltage (for example, a fixed bias voltage) is applied to a negative input terminal of the second op-amp OP2. A gate terminal of a fourth transistor T4, the gate terminal of the second bias transistor T6, and the output terminal of the second op-amp OP2 are connected to each other. The output terminal of the second op-amp OP2 is connected to the gate terminal of the fourth transistor T4.

A change between the power voltage and the ground (VDD/GND) input to a first terminal (for example, source terminal) of the fourth transistor T4 and the first terminal (for example, source terminal) of the second bias transistor T6 may be transferred to a bias voltage (at the gate terminal) of the second bias transistor T6.

A voltage at a second node N2 to which the gate terminal of the fourth transistor T4 is connected may be constantly maintained. Thus, Vgs or Vsg of the fourth transistor T4 connected to the second node N2 may be constantly maintained so that a constant current charging/discharging is ensured. A pulse generator 214a including the P-N-type delay cell 2000i may generate and output a pulse signal PULSE_OUT having a small delay difference.

A pulse generator according to least one exemplary embodiment of the present inventive concept can ensure a constant current charging/discharging by constantly maintaining Vgs or Vsg of a first transistor of a P-type delay cell, to which a power voltage VDD is supplied. The pulse generator including the P-type delay cell can generate and output a pulse signal PULSE_OUT having a small delay difference.

A pulse generator according to at least one exemplary embodiment of the present inventive concept can ensure a constant current charging/discharging by constantly maintaining Vgs or Vsg of a fourth transistor of an N-type delay cell, which is connected to a ground GND terminal. The pulse generator including the N-type delay cell can generate and output a pulse signal PULSE_OUT having a small delay difference.

A pulse generator of according to at least one exemplary embodiment of the present inventive concept can ensure a constant current charging/discharging by constantly maintaining Vgs or Vsg of a first transistor of a P-N-type delay cell, which is connected to a power voltage VDD, and Vgs or Vsg of a fourth transistor of the P-N-type delay cell, which is connected to a ground GND terminal. The pulse generator including the P-N-type delay cell can generate and output a pulse signal PULSE_OUT having a small delay difference.

While embodiments of the present inventive concept have been described with reference to the accompanying drawings, it should be understood by those skilled in the art that various modifications may be made without departing from the scope of the present inventive concept.

What is claimed is:

1. A pulse generator of an image sensor, the pulse generator configured to output a pulse signal on the basis of a transition of a comparison signal input from a comparator, the pulse generator comprising a delay cell,
   wherein the delay cell comprises:
   a plurality of transistors arranged in series between a power voltage and a ground, wherein the power voltage is supplied to a first terminal of a first transistor disposed first among the plurality of transistors and a gate terminal of the first transistor is connected to a first node, and an input voltage is supplied to a gate terminal of an n-th transistor disposed last among the plurality of transistors and a ground voltage is supplied to a first terminal of the n-th transistor;
   a stabilization capacitor connected between the first terminal of the first transistor and the first node; and
   a stabilization switch disposed between a reference voltage input terminal providing a reference voltage and the first node, wherein the stabilization switch supplies the reference voltage to the first node when turned on by an input bias control signal, where n is greater than one.

2. The pulse generator of claim 1, wherein the stabilization switch maintains an on-state before a reset signal is output so that the reference voltage is supplied to the gate terminal of the first transistor and maintains an off-state during a period in which the reset signal is output.

3. The pulse generator of claim 2, wherein the stabilization switch maintains the on-state before the pulse signal is output so that the reference voltage is supplied to the gate terminal of the first transistor and maintains the off-state during a period in which the pulse signal is output.

4. The pulse generator of claim 1, wherein the reference voltage is supplied to the first node so that a voltage across source and gate terminals of the first transistor is constantly maintained.

5. The pulse generator of claim 4, wherein among the plurality of transistors, the input voltage is supplied to a gate terminal of a second transistor connected in series with the first transistor and a gate terminal of a third transistor connected in series with the second transistor.

6. The pulse generator of claim 4, wherein k transistors connected to each other in series are disposed between the first transistor and the n-th transistor, and a gate terminal of at least one transistor of the k transistors is connected to the first node, where k is at least one.

7. The pulse generator of claim 6, wherein the reference voltage is supplied to the first node so that a voltage across source and gate terminals of the at least one transistor is constantly maintained.

8. The pulse generator of claim 1, wherein the first transistor is a metal-oxide-semiconductor (MOS) transistor of a first type, and the n-th transistor is a MOS transistor of a second type different from the first type.

9. A pulse generator of an image sensor, the pulse generator configured to output a pulse signal on the basis of a transition of a comparison signal input from a comparator, the pulse generator comprising a delay cell,
   wherein the delay cell comprises:
   a plurality of transistors arranged in series between a power voltage and a ground, wherein the power voltage is supplied to a first terminal of a first transistor disposed first among the plurality of transistors and an input voltage is supplied to a gate terminal of the first transistor, and a ground voltage is supplied to a first terminal of an n-th transistor disposed last among the plurality of transistors and a gate terminal of the n-th transistor is connected to a first node;
   a stabilization capacitor connected between the first terminal of the n-th transistor and the first node; and
   a stabilization switch disposed between a reference voltage input terminal providing a reference voltage and the first node, wherein the stabilization switch supplies the reference voltage to the first node when turned on by an input bias control signal, where n is greater than one.

10. The pulse generator of claim 9, wherein the stabilization switch maintains an on-state before a reset signal is output so that the reference voltage is supplied to the gate terminal of the n-th transistor and maintains an off-state during a period in which the reset signal is output.

11. The pulse generator of claim 10, wherein the stabilization switch maintains the on-state before the pulse signal is output so that the reference voltage is supplied to the gate terminal of the n-th transistor and maintains the off-state during a period in which the pulse signal is output.

12. The pulse generator of claim 9, wherein the reference voltage is supplied to the first node so that a voltage across source and gate terminals of the n-th transistor is constantly maintained.

13. The pulse generator of claim 12, wherein among the plurality of transistors, the input voltage is supplied to a gate terminal of a second transistor connected in series with the first transistor and a gate terminal of a third transistor connected in series with the second transistor.

14. The pulse generator of claim 12, wherein k transistors connected to each other in series are disposed between the first transistor and the n-th transistor, and a gate terminal of at least one transistor of the k transistors is connected to the first node, where k is at least one.

15. The pulse generator of claim 14, wherein the reference voltage is supplied to the first node so that a voltage across source and gate terminals of the at least one transistor is constantly maintained.

16. The pulse generator of claim 9, wherein the first transistor is a metal-oxide-semiconductor (MOS) transistor of a first type, and the n-th transistor is a MOS transistor of a second type different from the first type.

17. A pulse generator of an image sensor, the pulse generator configured to output a pulse signal on the basis of a transition of a comparison signal input from a comparator, the pulse generator comprising a delay cell,
wherein the delay cell comprises:
a plurality of transistors arranged in series between a power voltage and a ground, wherein the power voltage is supplied to a first terminal of a first transistor disposed first among the plurality of transistors and a gate terminal of the first transistor is connected to a first node, and a ground voltage is supplied to a first terminal of an n-th transistor disposed last among the plurality of transistors and a gate terminal of the n-th transistor is connected to a second node;
a first stabilization capacitor connected between the first terminal of the first transistor and the first node;
a first stabilization switch disposed between a first reference voltage input terminal supplying a first reference voltage and the first node, wherein the first stabilization switch supplies the first reference voltage to the first node when turned on by an input bias control signal;
a second stabilization capacitor connected between a second terminal of the n-th transistor and the second node; and
a second stabilization switch disposed between a second reference voltage input terminal supplying a second reference voltage and the second node, wherein the second stabilization switch supplies the second reference voltage to the second node when turned on by the input bias control signal, where n is greater than one.

18. The pulse generator of claim 17, wherein the first stabilization switch maintains an on-state before a reset signal is output so that the first reference voltage is supplied to the gate terminal of the first transistor and maintains an off-state during a period in which the reset signal is output.

19. The pulse generator of claim 18, wherein the reference voltage is supplied to the first node so that a voltage across source and gate terminals of the first transistor is constantly maintained.

20. The pulse generator of claim 17, wherein the second stabilization switch maintains an on-state before a reset signal is output so that the second reference voltage is supplied to the gate terminal of the n-th transistor and maintains an off-state during a period in which the reset signal is output.

* * * * *